United States Patent
Koezuka et al.

(10) Patent No.: US 8,809,154 B2
(45) Date of Patent: Aug. 19, 2014

(54) SEMICONDUCTOR DEVICE AND METHOD FOR MANUFACTURING THE SAME

(71) Applicant: Semiconductor Energy Laboratory Co., Ltd., Atsugi (JP)

(72) Inventors: Junichi Koezuka, Tochigi (JP); Kenichi Okazaki, Tochigi (JP); Yasuharu Hosaka, Tochigi (JP); Terumasa Ikeyama, Toride (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/721,972

(22) Filed: Dec. 20, 2012

(65) Prior Publication Data

US 2013/0164899 A1 Jun. 27, 2013

(30) Foreign Application Priority Data

Dec. 27, 2011 (JP) .................................. 2011-285559

(51) Int. Cl.
*H01L 21/336* (2006.01)

(52) U.S. Cl.
USPC ............ 438/299; 438/151; 438/158; 438/164

(58) Field of Classification Search
USPC .......... 438/149, 151, 158, 164, 299, 300, 301
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Kevin M Picardat
(74) *Attorney, Agent, or Firm* — Eric J. Robinson; Robinson Intellectual Property Law Office, P.C.

(57) ABSTRACT

A highly reliable semiconductor device in which a transistor including an oxide semiconductor film has stable electric characteristics is manufactured. In the semiconductor device which includes an inverted-staggered transistor having a bottom-gate structure and being provided over a substrate having an insulating surface, at least a first gate insulating film and a second gate insulating film are provided between a gate electrode layer and an oxide semiconductor film, and heat treatment is performed at a temperature of 450° C. or higher, preferably 650° C. or higher, and then the oxide semiconductor film is formed. By the heat treatment at a temperature of 450° C. or higher before the formation of the oxide semiconductor film, diffusion of hydrogen elements into the oxide semiconductor film, which causes degradation or variations in electric characteristics of the transistor, can be reduced, so that the transistor can have stable electric characteristics.

22 Claims, 14 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,180,156 B2 | 2/2007 | Chang et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,679,085 B2 | 3/2010 | Jun et al. |
| 7,732,819 B2 | 6/2010 | Akimoto et al. |
| 7,800,110 B2 | 9/2010 | Kim et al. |
| 8,164,256 B2 | 4/2012 | Sano et al. |
| 8,207,014 B2 | 6/2012 | Sasaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2007/0296003 A1 | 12/2007 | Park et al. |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0025679 A1 | 2/2010 | Yamazaki et al. |
| 2010/0065844 A1 | 3/2010 | Tokunaga |
| 2010/0084648 A1 | 4/2010 | Watanabe |
| 2010/0092800 A1 | 4/2010 | Itagaki et al. |
| 2010/0109002 A1 | 5/2010 | Itagaki et al. |
| 2010/0301328 A1 | 12/2010 | Yamazaki et al. |
| 2010/0301329 A1* | 12/2010 | Asano et al. ............. 257/43 |
| 2011/0003430 A1 | 1/2011 | Yamazaki et al. |
| 2011/0068336 A1* | 3/2011 | Yamazaki et al. ........... 257/43 |
| 2011/0079778 A1 | 4/2011 | Yamazaki et al. |
| 2011/0084273 A1 | 4/2011 | Yamazaki et al. |
| 2011/0092017 A1 | 4/2011 | Akimoto et al. |
| 2011/0193079 A1 | 8/2011 | Endo et al. |
| 2012/0187395 A1* | 7/2012 | Koezuka ............. 257/43 |
| 2012/0231580 A1* | 9/2012 | Yamazaki et al. ........ 438/104 |
| 2013/0009147 A1 | 1/2013 | Koyama et al. |
| 2013/0099232 A1 | 4/2013 | Cho et al. |
| 2013/0137226 A1* | 5/2013 | Yamade et al. ............. 438/197 |
| 2013/0140554 A1 | 6/2013 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-123861 | 5/2005 |
| JP | 2007-096055 | 4/2007 |
| JP | 2007-123861 | 5/2007 |
| JP | 2008-141119 | 6/2008 |
| WO | WO 2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology,", SID Digest '04 : SID International Symposium Digest of Technical Papers, 2004, vol. 35, pp. 860-863.

(56) References Cited

OTHER PUBLICATIONS

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2000, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholestric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,",

(56) References Cited

OTHER PUBLICATIONS

SID Digest '09 : SID International Symposium Digest of Technical Papers, May 31, 2009, pp. 578-581.
Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.
Lee.H et al., "Current Status of, Challenges to, and Perspective View of AM-OLED,", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.
Nakamura.M, "Synthesis of Homologous Compound with New Long-Period Structure,", NIRIM Newsletter, Mar. 1, 1995, vol. 150, pp. 1-4.
Kikuchi.H et al., "Polymer-Stabilized Liquid Crystal Blue Phases,", Nature Materials, Sep. 2, 2002, vol. 1, pp. 64-68.
Kimizuka.N et al., "Spinel,YbFe2O4, andYb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.
Kitzerow.H et al., "Observation of Blue Phases in Chiral Networks,", Liquid Crystals, 1993, vol. 14, No. 3, pp. 911-916.
Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.
Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.
Orita.M et al., "Mechanism of Electrical Conductivity of Transparent InGaZnO4,", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.
Janotti.A et al., "Native Point Defects in ZnO,", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.
Janotti.A et al., "Oxygen Vacancies in ZnO,", Appl. Phys. Lett. (Applied Physics Letters) , 2005, vol. 87, pp. 122102-1-122102-3.
Oba.F et al., "Defect energetics in ZnO: A hybrid Hartree-Fock density functional study,", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor,", Philosophical Magazine, 2001, vol. 81, No. 5, pp. 501-515.
Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays,", IDW '08 : Proceedings of the 6th International Display Workshops, Dec. 3, 2008, pp. 581-584.
Kim.S et al., "High-Performance oxide thin film transistors passivated by various gas plasmas,", 214th ECS Meeting, 2008, No. 2317, ECS.
Clark.S et al., "First Principles Methods Using CASTEP,", Zeitschrift fur Kristallographie, 2005, vol. 220, pp. 567-570.
Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.
Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

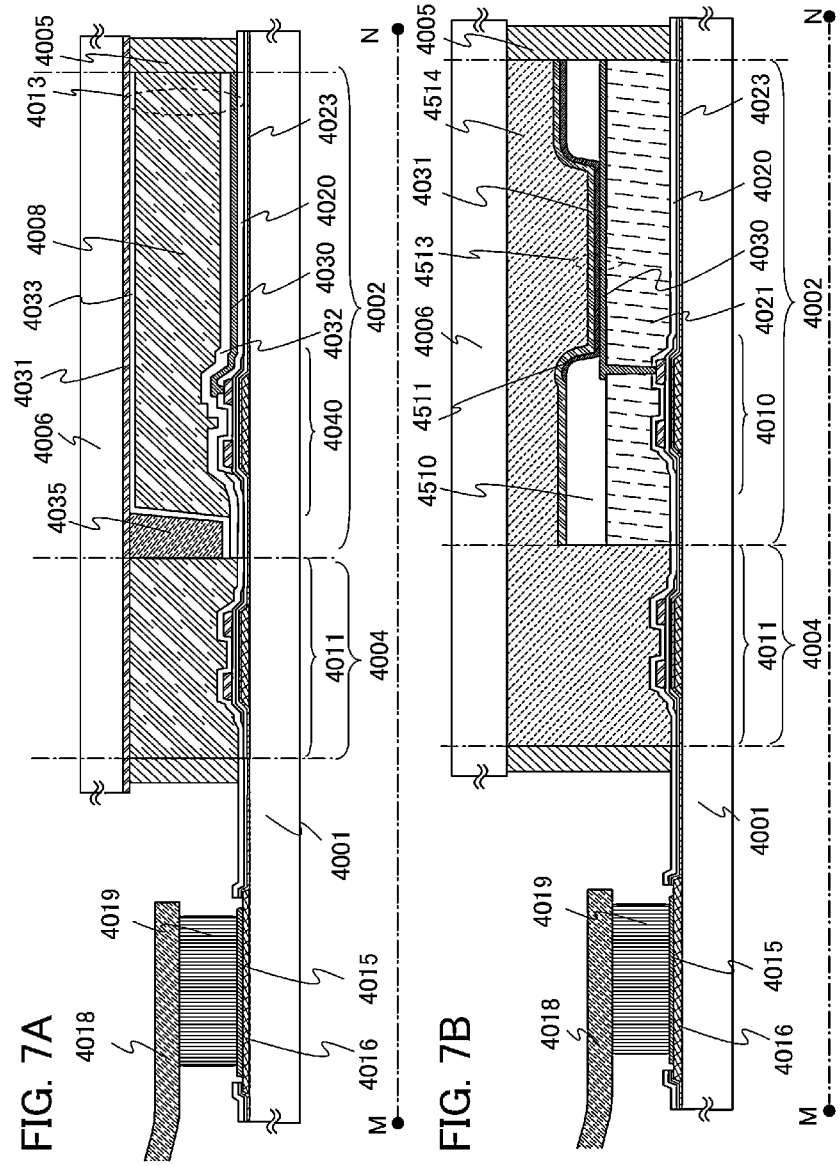

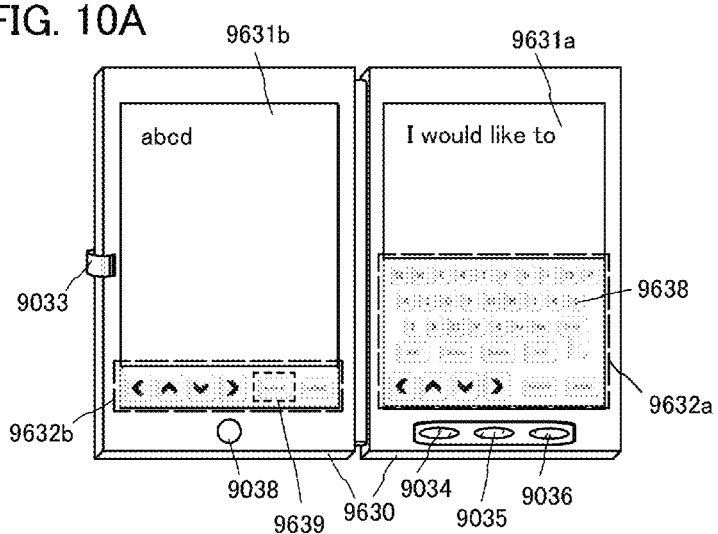
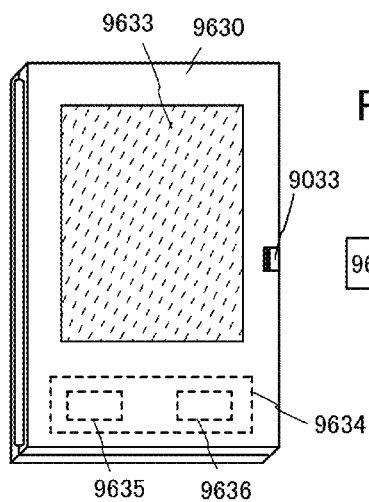
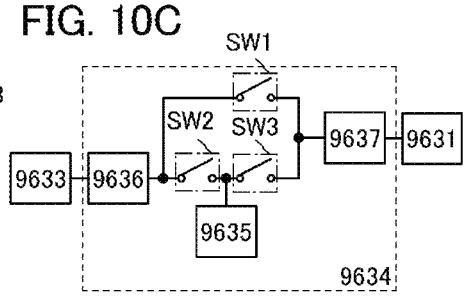

SEMICONDUCTOR DEVICE AND METHOD FOR MANUFACTURING THE SAME

BACKGROUND OF THE INVENTION

1. Field of the Invention

The present invention relates to a semiconductor device including an oxide semiconductor and a manufacturing method thereof.

In this specification, semiconductor devices refer to all types of devices which can function by utilizing semiconductor characteristics; an electro-optical device, a semiconductor circuit, and an electronic device are all semiconductor devices.

2. Description of the Related Art

Many transistors formed over a glass substrate or the like are manufactured using amorphous silicon, polycrystalline silicon, or the like, as typically seen in liquid crystal display devices. Although transistors including amorphous silicon have low field-effect mobility, they can be formed over a larger glass substrate. On the other hand, although transistors including polycrystalline silicon have high field-effect mobility, they are not suitable for being formed over a larger glass substrate.

Other than a transistor formed including silicon, a technique in which a transistor is manufactured using an oxide semiconductor and applied to an electronic device or an optical device has attracted attention. For example, a technique in which a transistor is manufactured using zinc oxide or In—Ga—Zn-based oxide as an oxide semiconductor, and the transistor is used as a switching element of a pixel of a display device is disclosed in Patent Document 1 and Patent Document 2.

In an oxide semiconductor, part of hydrogen behaves as a donor and releases electrons as carriers. When the carrier concentration in the oxide semiconductor becomes high, a channel is formed in the transistor without voltage application to its gate. Therefore, the threshold voltage of the transistor shifts in the negative direction and it is difficult to control the threshold voltage.

In Patent Document 3, it is disclosed that by adding hydrogen into an oxide semiconductor film, the electrical conductivity of the oxide semiconductor film is increased by four to five orders of magnitude approximately. It is also disclosed that hydrogen is diffused into the oxide semiconductor film from an insulating film which is in contact with the oxide semiconductor film.

REFERENCE

[Patent Document 1] Japanese Published Patent Application No. 2007-123861

[Patent Document 2] Japanese Published Patent Application No. 2007-096055

[Patent Document 3] Japanese Published Patent Application No. 2008-141119

SUMMARY OF THE INVENTION

An object of one embodiment of the present invention is to manufacture a highly reliable semiconductor device in which a transistor including an oxide semiconductor film has stable electric characteristics.

In a semiconductor device including an inverted-staggered transistor having a bottom-gate structure provided over a substrate having an insulating surface, at least a first gate insulating film and a second gate insulating film are provided between a gate electrode layer and an oxide semiconductor film, and heat treatment is performed at a temperature of 450° C. or higher, preferably 650° C. or higher, and then the oxide semiconductor film is formed.

A nitride insulating film can be used for the first gate insulating film. For example, a silicon nitride film and a silicon nitride oxide film can be used. The first gate insulating film may have a single-layer structure or a layered structure. The thickness of the first gate insulating film is greater than or equal to 20 nm and less than or equal to 350 nm. In the case where a glass substrate is used as a substrate, the first gate insulating film has a function of a barrier film that prevents diffusion of an impurity contained in the glass substrate. In the case where copper or the like is used as a material for the gate electrode layer, the first gate insulating film has a function of a barrier film that prevents diffusion of a copper element. Note that since a nitride insulating film contains a hydrogen element, when the hydrogen element is released from the nitride insulating film and diffuses into the oxide semiconductor film by heat treatment or the like after formation of the oxide semiconductor film, the hydrogen element bonds to oxygen in the oxide semiconductor film, so that $H_2O$ or the like formed in this manner is released. Thus, oxygen deficiency occurs in the oxide semiconductor film, which may cause degradation or variations in electric characteristics of a transistor. Specifically, the transistor might have normally-on characteristics.

By the heat treatment at a temperature of 450° C. or higher, preferably 650° C. or higher before the formation of the oxide semiconductor film, diffusion of hydrogen elements into the oxide semiconductor film, which causes degradation or variations in electric characteristics of the transistor, can be reduced, so that the transistor can have stable electric characteristics.

It is preferable that deposition conditions be set such that the concentration of hydrogen in the first gate insulating film just after the deposition is low. Similarly, it is preferable that deposition conditions be set such that the concentration of hydrogen in the second gate insulating film just after the deposition is low. In addition, the amount of hydrogen released from the film is preferably reduced by performing heat treatment at a temperature 450° C. or higher, preferably 650° C. or higher after the formation of the second gate insulating film.

Preferable conditions for forming the oxide semiconductor film are as follows: a sputtering target which is polycrystalline and has a high relative density (a high filling rate) is used; the sputtering target is sufficiently cooled to room temperature; the temperature of a surface of the substrate on which the oxide semiconductor film is deposited is set at room temperature or higher; and moisture and hydrogen hardly exist in an atmosphere in a deposition chamber.

The higher density of the sputtering target is more preferable. When the density of the sputtering target is increased, the density of a film to be deposited can also be increased. Specifically, the relative density (the filling rate) of the sputtering target is set to higher than or equal to 90% and lower than or equal to 100%, preferably higher than or equal to 95%, more preferably higher than or equal to 99.9%. Note that the relative density of the sputtering target refers to a ratio between the density of the sputtering target and the density of a material free of porosity having the same composition as the sputtering target.

To obtain a dense film, it is important to reduce an impurity remains in the deposition chamber. The back pressure (the ultimate degree of vacuum: a degree of vacuum before a reaction gas is introduced) in the deposition chamber is set at less than or equal to $5\times10^{-3}$ Pa, preferably $6\times10^{-5}$ Pa; and the pressure at the deposition is set at less than 2 Pa, preferably less than or equal to 0.4 Pa. The impurity in the deposition chamber is reduced by setting the back pressure to be low.

To obtain a dense film, it is also important to reduce an impurity contained in a gas that is introduced into the deposition chamber, i.e., a gas used at the deposition. It is also important that proportion of oxygen in the deposition gas be increased and the power be optimized. By increasing the proportion of oxygen in the deposition gas (the upper limit of proportion of oxygen: 100%) and optimizing the power, plasma damage at the time of deposition can be alleviated. Thus, a dense film is easily obtained.

Furthermore, for monitoring the amount of moisture and the like in the deposition chamber before and during the deposition, the deposition is preferably performed in a state where a quadrupole mass analyzer (hereinafter referred to as Q-mass) is always in operation.

The temperature of the surface of the substrate on which the oxide semiconductor film is deposited is a temperature at which water is not adsorbed, preferably a temperature higher than or equal to 150° C. and lower than or equal to 500° C.

One embodiment of the invention disclosed in this specification is a method for manufacturing a semiconductor device, which includes the steps of forming a gate electrode layer over a substrate having an insulating surface, a first gate insulating film over the gate electrode layer; forming a second gate insulating film over the first gate insulating film; performing a first heat treatment at a temperature higher than or equal to 650° C. after the formation of the second gate insulating film; forming an oxide semiconductor film over the second gate insulating film after the first heat treatment; and performing a second heat treatment after the formation of the oxide semiconductor film.

In the above structure, the first gate insulating film is a silicon nitride film formed by a plasma CVD method, and the second gate insulating film is a silicon oxynitride film formed by a plasma CVD method.

Note that the second heat treatment may be performed before or after etching of the oxide semiconductor film, and the temperature is higher than or equal to 350° C., preferably higher than or equal to 450° C., and less than or equal to the temperature of the first heat treatment.

A highly reliable semiconductor device which includes a transistor including an oxide semiconductor is provided.

BRIEF DESCRIPTION OF THE DRAWINGS

In the accompanying drawings:

FIGS. 7A and 7B are cross-sectional views each illustrating one embodiment of a semiconductor device.

FIGS. 10A to 10C illustrate electronic devices.

DETAILED DESCRIPTION OF THE INVENTION

Hereinafter, embodiments of the present invention will be described in detail with reference to the accompanying drawings. However, the present invention is not limited to the description below, and it is easily understood by those skilled in the art that modes and details can be modified in various ways. Therefore, the present invention is not construed as being limited to description of the embodiments.

Embodiment 1

In this embodiment, one embodiment of a semiconductor device and a method for manufacturing the semiconductor device will be described with reference to FIGS. 1A and 1B. In this embodiment, a transistor including an oxide semiconductor film will be described as an example of the semiconductor device.

The transistor may have a single-gate structure in which one channel formation region is formed, a double-gate structure in which two channel formation regions are formed, or a triple-gate structure in which three channel formation regions are formed. Alternatively, the transistor may have a dual-gate structure including two gate electrode layers positioned above and below a channel formation region with a gate insulating film provided therebetween.

Figure 1A:
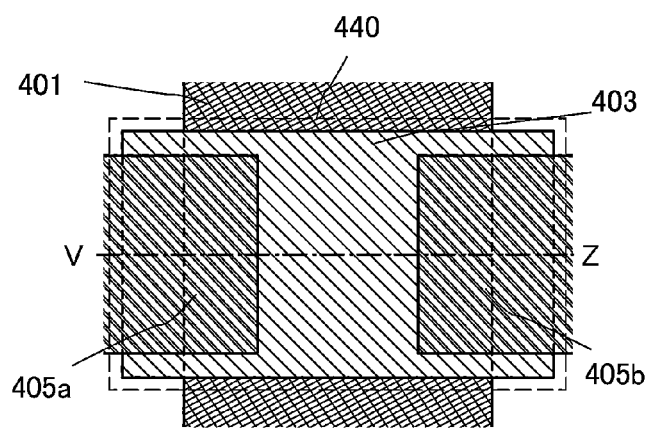
FIGS. 1A and 1B are a plan view and a cross-sectional view which illustrate one embodiment of a semiconductor device.
Figure 1B:
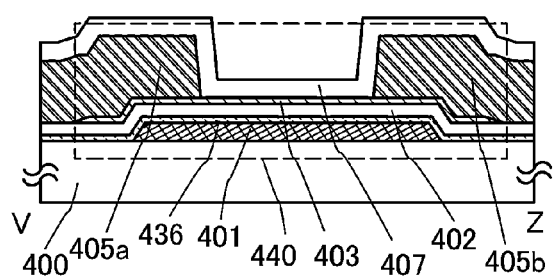

A transistor 440 illustrated in FIGS. 1A and 1B is an example of a transistor which is one kind of bottom-gate transistor and is also referred to as inverted-staggered transistor. FIG. 1A is a plan view, and FIG. 1B is a cross-sectional view taken along the chain line V-Z in FIG. 1A.

As illustrated in FIG. 1B which is the cross-sectional view of the transistor 440 in the channel length direction, a semiconductor device including the transistor 440 includes, over a glass substrate 400, a gate electrode layer 401 and a first gate insulating film 436 which is provided to cover the gate electrode layer 401; and a second gate insulating film 402, an oxide semiconductor film 403, a source electrode layer 405a, and a drain electrode layer 405b which are provided over the first gate insulating film 436. Furthermore, an insulating film 407 covering the transistor 440 is provided.

Examples of the substrate 400 include a substrate having an insulating surface such as a glass substrate or a semiconductor substrate (e.g., a single crystal silicon substrate) having an insulating film at the surface.

As the glass substrate, a variety of glass substrates for electronics industry, such as an aluminosilicate glass substrate, a barium borosilicate glass substrate, or an aluminoborosilicate glass substrate can be used. Note that the substrate preferably has a coefficient of thermal expansion greater than or equal to $25\times10^{-7}/°$ C. and less than or equal to $50\times10^{-7}/°$ C. (preferably, greater than or equal to $30\times10^{-7}/°$ C. and less than or equal to $40\times10^{-7}/°$ C.) and has a strain point greater than or equal to 650° C. and less than or equal to 750° C. (preferably, greater than or equal to 700° C. and less than or equal to 740° C.).

In the case where a large-sized glass substrate with any of the 5th generation (1000 mm×1200 mm or 1300 mm×1500 mm), the 6th generation (1500 mm×1800 mm), the 7th generation (1870 mm×2200 mm), the 8th generation (2200 mm×2500 mm), the 9th generation (2400 mm×2800 mm), and the 10th generation (2880 mm×3130 mm) is used, minute processing might become difficult owing to shrinkage of the substrate caused by heat treatment or the like in the process for manufacturing a semiconductor device. For this reason, in the case where the large-sized glass substrate described above is used as the substrate, the one with a shrinkage as less as possible is preferably used. For example, a large-sized glass substrate whose shrinkage by heat treatment at 450° C., preferably 500° C. performed thereon for one hour is 20 ppm or less, preferably 10 ppm or less, more preferably 5 ppm or less may be used as the substrate.

The first gate insulating film 436 and the second gate insulating film 402 are at least provided between the gate electrode layer 401 and the oxide semiconductor film 403. The first gate insulating film 436 provided on the gate electrode layer 401 side and the second gate insulating film 402 provided on the oxide semiconductor film 403 side have different compositions.

A nitride insulating film obtained by a plasma CVD method is used as the first gate insulating film 436. For example, a silicon nitride film, a silicon nitride oxide film, and a metal nitride insulating film (e.g., an aluminum nitride film and an aluminum nitride oxide film) are given. The thickness of the first gate insulating film 436 can be greater than or equal to 20 nm and less than or equal to 350 nm. The first gate insulating film 436 may have a single-layer structure or a layered structure.

An oxide insulating film obtained by a plasma CVD method is used as the second gate insulating film 402. For example, a silicon oxide film and a silicon oxynitride film are given. Other than the above, for example, a metal oxide insulating film containing one or more selected from metal elements consisting of titanium (Ti), molybdenum (Mo), tungsten (W), hafnium (Hf), tantalum (Ta), lanthanum (La), zirconium (Zr), nickel (Ni), magnesium (Mg), barium (Ba), and aluminum (Al) (e.g., an aluminum oxide film, an aluminum oxynitride film, a hafnium oxide film, a magnesium oxide film, a zirconium oxide film, a lanthanum oxide film, or a barium oxide film) can be used as the second gate insulating film 402.

The thickness of the second gate insulating film 402 can be greater than or equal to 50 nm and less than or equal to 300 nm. The second gate insulating film 402 may have a single-layer structure or a layered structure.

As the oxide semiconductor used for the oxide semiconductor film 403, it is possible to use any of the following oxides: indium oxide; tin oxide; zinc oxide; a two-component metal oxide such as an In—Zn-based oxide or an In—Ga-based oxide; a three-component metal oxide such as an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn-based oxide" means an oxide containing In, Ga, and Zn as its main component and there is no particular limitation on the ratio of In:Ga:Zn. The In—Ga—Zn-based oxide may contain a metal element other than the In, Ga, and Zn.

Alternatively, a material represented by $InMO_3(ZnO)_m$ (m>0, m is not an integer) may be used as the oxide semiconductor. Note that M represents one or more metal elements selected from Ga, Fe, Mn, and Co. Further alternatively, a material represented by $In_2SnO_5(ZnO)_n$ (n>0, n is an integer) may be used as the oxide semiconductor.

For example, an In—Ga—Zn-based oxide with an atomic ratio of In:Ga:Zn=1:1:1 (=1/3:1/3:1/3), In:Ga:Zn=2:2:1 (=2/5:2/5:1/5), In:Ga:Zn=3:1:2 (=1/2:1/6:1/3), or any of oxides composition of which is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides composition of which is in the neighborhood of the above compositions can be used.

However, without limitation to the materials given above, a material with an appropriate composition may be used as the oxide semiconductor containing indium depending on needed semiconductor characteristics (e.g., mobility, threshold voltage, and variation). To obtain the required semiconductor characteristics, it is preferable that the carrier concentration, the impurity concentration, the defect density, the atomic ratio between a metal element and oxygen, the interatomic distance, the density, and the like be set to appropriate values.

For example, high mobility can be obtained relatively easily in the case of using an In—Sn—Zn-based oxide. However, mobility can be increased by reducing the defect density in a bulk also in the case of using an In—Ga—Zn-based oxide.

Note that for example, the expression "the composition of an oxide including In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2 \le r^2$. For example, r may be 0.05. The same applies to other oxides.

The oxide semiconductor film 403 has a thickness greater than or equal to 1 nm and less than or equal to 50 nm (preferably greater than or equal to 5 nm and less than or equal to 40 nm) and can be formed by a sputtering method, a molecular beam epitaxy (MBE) method, a CVD method, a pulse laser deposition method, an atomic layer deposition (ALD) method, or the like as appropriate. The oxide semiconductor film 403 may be formed with a sputtering apparatus which performs deposition in the state where top surfaces of a plurality of substrates are substantially perpendicular to a top surface of a sputtering target.

The oxide semiconductor film 403 can be in a single crystal state, a polycrystalline (also referred to as polycrystal) state, an amorphous state, or the like.

The oxide semiconductor film 403 is preferably a CAAC-OS (c-axis aligned crystalline oxide semiconductor) film.

The CAAC-OS film is neither completely single crystal nor completely amorphous. The CAAC-OS film is an oxide semiconductor film with a crystal-amorphous mixed phase structure where crystal parts are included in an amorphous phase. Note that in most cases, the crystal part fits inside a cube one side of which is less than 100 nm From an observation image obtained with a transmission electron microscope (TEM), a boundary between an amorphous part and a crystal part in the CAAC-OS film is not clear. Furthermore, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in the direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the process of forming the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Furthermore, by adding an impurity to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

In a transistor including the use of the CAAC-OS film, change in electric characteristics due to irradiation with visible light or ultraviolet light is small. Therefore, the transistor has high reliability.

FIGS. 2A to 2E illustrate an example of a method for manufacturing a semiconductor device including the transistor 440.

Figure 2A:
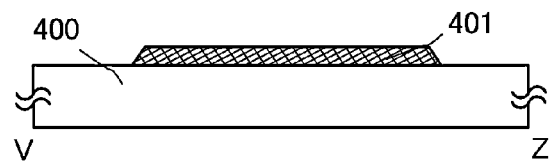
FIGS. 2A to 2E are cross-sectional views illustrating one embodiment of a method for manufacturing a semiconductor device.

First, a glass substrate is used as the substrate 400, and a conductive film is formed over the glass substrate and is etched into the gate electrode layer 401 (see FIG. 2A). The conductive film may be etched using either dry etching or wet etching or both.

The gate electrode layer 401 can be formed using a metal material such as molybdenum, titanium, tantalum, tungsten, aluminum, copper, chromium, neodymium, or scandium or an alloy material containing any of these materials as its main component.

In this embodiment, a 100-nm-thick tungsten film is formed by a sputtering method.

Figure 2B:
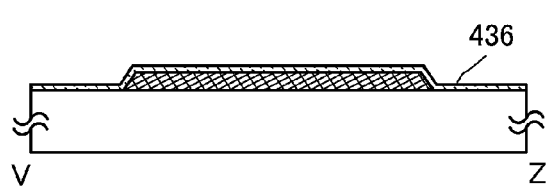

Next, the first gate insulating film 436 is provided to cover the gate electrode layer 401 (see FIG. 2B).

The first gate insulating film 436 can be formed using a nitride insulating film formed by a plasma CVD method or the like. For example, a silicon nitride film and a silicon nitride oxide film are given. The first gate insulating film 436 may have a single-layer structure or a layered structure.

In this embodiment, as the first gate insulating film 436, a 50-nm-thick silicon nitride film formed by a plasma CVD method is used.

Since the gate electrode layer 401 is covered with the first gate insulating film 436, a metal element contained in the glass substrate 400 can be prevented from diffusing into the second gate insulating film 402 even when the metal element is attached to the surface of the gate electrode layer 401 in the etching step for forming the gate electrode layer 401.

Next, the second gate insulating film 402 is formed over the first gate insulating film 436.

The thickness of the second gate insulating film 402 is greater than or equal to 50 nm and less than or equal to 300 nm Here, a 200-nm-thick silicon oxynitride film formed by a plasma CVD method is used as the second gate insulating film 402.

After the formation of the second gate insulating film 402, the glass substrate 400, the gate electrode layer 401, the first gate insulating film 436, and the second gate insulating film 402 may be subjected to heat treatment. For example, the heat treatment can be performed at 650° C. for one minute to six minutes with a gas rapid thermal annealing (GRTA) apparatus which performs heat treatment using a high-temperature gas. As the high-temperature gas in the GRTA apparatus, an inert gas which does not react with an object to be processed by heat treatment, such as nitrogen or a rare gas like argon, is used. Alternatively, the heat treatment may be performed at a temperature of 450° C. or higher for 30 minutes to one hour with an electric furnace.

Here, the following experiment was carried out.

A first insulating film having the same thickness as the first gate insulating film 436 and a second insulating film having the same thickness as the second gate insulating film 402 were formed over a single crystal silicon substrate, and the amount of released hydrogen ($H_2$) was measured by thermal desorption spectroscopy (TDS).

A silicon nitride film was formed as the first insulating film under the following conditions: flow rate of a silane gas, 90 sccm; flow rate of a nitrogen gas, 4000 sccm; flow rate of an $NH_3$ gas, 2700 sccm; RF power, 2000 W; deposition pressure, 200 Pa; and substrate temperature, 350° C. A silicon oxynitride film was formed as the second insulating film under the following conditions: flow rate of a silane gas, 20 sccm; flow rate of an $N_2O$ gas, 3000 sccm; RF power, 100 W; deposition pressure, 40 Pa; and substrate temperature, 350° C.

Sample 1 was not subjected to heat treatment. Sample 2 was subjected to heat treatment under a nitrogen atmosphere at 350° C. for one hour. Sample 3 was subjected to heat treatment under a nitrogen atmosphere at 450° C. for one hour. Sample 4 was subjected to heat treatment under a nitrogen atmosphere at 650° C. for six minutes.

Figure 11:
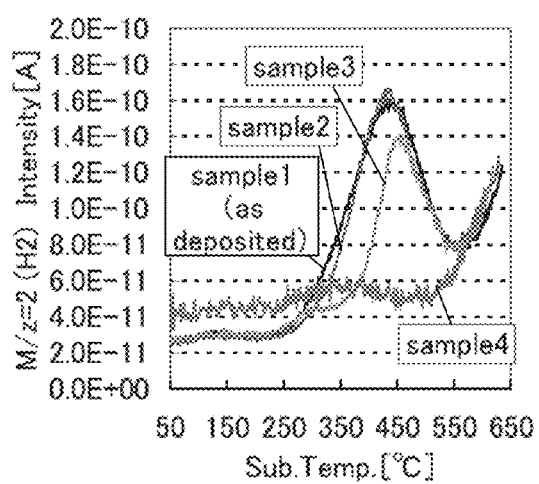
FIG. 11 is a graph showing the results of TDS measurement.

FIG. 11 shows the results of TDS measurement of Samples 1 to 4 each of which was measured at substrate temperatures up to 650° C.

FIG. 11 shows that the amount of a released hydrogen gas can be reduced by performing the heat treatment at 450° C. for one hour after the formation of the second insulating film. Furthermore, a large amount of a released hydrogen gas can be reduced by performing the heat treatment at 650° C. for six minutes after the formation of the second insulating film.

The results of this experiment show that by performing heat treatment at a temperature of 450° C. or higher, preferably at 650° C. after the formation of the second gate insulating film 402, the hydrogen concentration in the film can be reduced, and the amount of a released hydrogen gas can be reduced.

An experiment in which the deposition conditions for the first insulating film were changed and the amounts of a released hydrogen gas were compared was conducted.

Here, only a silicon nitride film was formed over a single crystal silicon substrate, and was subjected to TDS measurement. A 50-nm-thick silicon nitride film was formed as Sample 5 under the following conditions: flow rate of a silane gas, 90 sccm; flow rate of a nitrogen gas, 4000 sccm; flow rate of an $NH_3$ gas, 2700 sccm; RF power, 2000 W; deposition pressure, 200 Pa; and substrate temperature, 350° C. A 50-nm-thick silicon nitride film was formed as Sample 6 under the following conditions: flow rate of a silane gas, 30 sccm; flow rate of a nitrogen gas, 1500 sccm; flow rate of an $NH_3$ gas, 1500 sccm; RF power, 150 W; deposition pressure, 40 Pa; and substrate temperature, 350° C. A 50-nm-thick silicon nitride film was formed as Sample 7 under the following conditions: flow rate of a silane gas, 30 sccm; flow rate of a nitrogen gas, 900 sccm; flow rate of an $NH_3$ gas, 900 sccm; RF power, 150 W; deposition pressure, 40 Pa; and substrate temperature, 350° C. A 50-nm-thick silicon nitride film was formed as Sample 8 under the following conditions: flow rate of a silane gas, 30 sccm; flow rate of a nitrogen gas, 300 sccm; flow rate of an $NH_3$ gas, 300 sccm; RF power, 150 W; deposition pressure, 40 Pa; and substrate temperature, 350° C.

Samples 5 to 8 were measured by TDS at substrate temperatures up to 650° C. As the result, Sample 6 had the smallest amount of a released hydrogen gas.

In this embodiment, the silicon nitride film formed under the deposition conditions for Sample 6 is used as the first gate insulating film 436. As the second gate insulating film 402, a silicon oxynitride film is formed under the following conditions: flow rate of a silane gas, 20 sccm; flow rate of an $N_2O$ gas, 3000 sccm; RF power, 100 W; deposition pressure, 40 Pa; and substrate temperature, 350° C. After the formation of the second gate insulating film 402, heat treatment is performed thereon at a temperature of 450° C. or higher, preferably at 650° C.

Figure 2C:
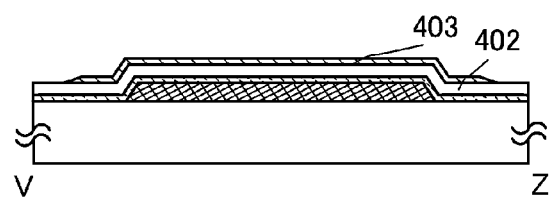

After the heat treatment, the oxide semiconductor film 403 is formed over the second gate insulating film 402 (see FIG. 2C).

In order that hydrogen or water will not enter the oxide semiconductor film 403 as much as possible in the formation step of the oxide semiconductor film 403, the substrate over which the second gate insulating film 402 is provided is preferably preheated in a preheating chamber in a sputtering apparatus as pretreatment for formation of the oxide semiconductor film 403 so that impurities such as hydrogen and moisture adsorbed onto the substrate and the second gate insulating film 402 are eliminated and evacuated. As an evacuation unit provided in the preheating chamber, a cryopump is preferable.

Planarization treatment may be performed on the region of the second gate insulating film 402 which is in contact with the oxide semiconductor film 403. As the planarization treatment, polishing treatment (e.g., a chemical mechanical polishing (CMP) method), dry etching treatment, or plasma treatment can be used, though there is no particular limitation on the planarization treatment.

As plasma treatment, reverse sputtering in which an argon gas is introduced and plasma is generated can be performed. The reverse sputtering is a method in which voltage is applied to a substrate side with the use of an RF power source in an argon atmosphere and plasma is generated in the vicinity of the substrate so that a substrate surface is modified. Note that instead of an argon atmosphere, a nitrogen atmosphere, a helium atmosphere, an oxygen atmosphere, or the like may be used. The reverse sputtering can remove particle substances (also referred to as particle or dust) attached to the surface of the second gate insulating film 402.

As the planarization treatment, polishing treatment, dry etching treatment, or plasma treatment may be performed plural times, or these treatments may be performed in combination. In the case where the treatments are combined, the order of steps is not particularly limited and may be set as appropriate depending on the roughness of the surface of the second gate insulating film 402.

Note that it is preferable that the oxide semiconductor film 403 be formed under conditions that much oxygen is contained during film formation (e.g., deposited by a sputtering method under a 100% oxygen atmosphere), so that a film containing much oxygen (preferably including a region containing oxygen in excess of the stoichiometric composition of an oxide semiconductor in a crystalline state) is formed.

Note that in this embodiment, as the oxide semiconductor film 403, a 35-nm-thick In—Ga—Zn-based oxide film (IGZO film) is formed by a sputtering method with a sputtering apparatus including an AC power supply device. In this embodiment, an In—Ga—Zn-based oxide target with an atomic ratio of In:Ga:Zn=1:1:1 (=1/3:1/3:1/3) is used. Note that deposition conditions are as follows: atmosphere, oxygen gas and argon gas (the flow rate of oxygen: 50%); pressure, 0.6 Pa; electric power, 5 kW; and substrate temperature, 170° C. Here, the deposition rate is 16 nm/min.

It is preferable that a high-purity gas from which an impurity such as hydrogen, water, a hydroxyl group, or hydride is removed be used as a sputtering gas when the oxide semiconductor film 403 is deposited.

The substrate is held in a deposition chamber kept under reduced pressure. Then, a sputtering gas from which hydrogen and moisture are removed is introduced while residual moisture in the deposition chamber is removed, and the oxide semiconductor film 403 is deposited over the glass substrate 400 using the above target. To remove the residual moisture in the deposition chamber, an entrapment vacuum pump such as a cryopump, an ion pump, or a titanium sublimation pump is preferably used. As an evacuation unit, a turbo molecular pump to which a cold trap is added may be used. In the deposition chamber which is evacuated with the cryopump, for example, a hydrogen atom, a compound containing a hydrogen atom, such as water ($H_2O$), (more preferably, also a compound containing a carbon atom), and the like are evacuated, whereby the concentration of an impurity contained in the oxide semiconductor film 403 deposited in the deposition chamber can be reduced.

The oxide semiconductor film 403 can be formed by processing an oxide semiconductor film into an island shape by a photolithography process.

Further, a resist mask for forming the island-shaped oxide semiconductor film 403 may be formed by an ink-jet method. Formation of the resist mask by an ink jet method needs no photomask; thus, manufacturing cost can be reduced.

Note that the etching of the oxide semiconductor film may be performed using either dry etching or wet etching, or using both dry etching and wet etching. As an etchant used for wet etching of the oxide semiconductor film, for example, a mixed solution of phosphoric acid, acetic acid, and nitric acid, or the like can be used. In addition, ITO07N (produced by KANTO CHEMICAL CO., INC.) may also be used. Further alternatively, the oxide semiconductor film may be etched by a dry etching method using an inductively coupled plasma (ICP) etching method.

Further, heat treatment may be performed on the oxide semiconductor film 403 in order to remove excess hydrogen (including water and a hydroxyl group) (to perform a dehydration or dehydrogenation treatment). The temperature of the heat treatment is higher than or equal to 300° C. and lower than or equal to 700° C., or lower than the strain point of the substrate. The heat treatment can be performed under reduced pressure, in a nitrogen atmosphere, or the like.

In addition, in the case where a crystalline oxide semiconductor film is used as the oxide semiconductor film 403, heat treatment for crystallization may be performed.

In this embodiment, the substrate is introduced into an electric furnace which is one of heat treatment apparatuses, and the oxide semiconductor film 403 is subjected to heat treatment at 350° C. in a nitrogen atmosphere for one hour and then subjected to another heat treatment at 350° C. in an atmosphere containing nitrogen and oxygen for one hour.

Note that the heat treatment apparatus is not limited to an electric furnace, and an apparatus for heating an object to be processed by heat conduction or heat radiation from a heating element such as a resistance heating element may be used. For example, a rapid thermal annealing (RTA) apparatus such as a gas rapid thermal annealing (GRTA) apparatus or a lamp rapid thermal annealing (LRTA) apparatus can be used. The LRTA apparatus is an apparatus for heating an object to be processed by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. In the GRTA apparatus, heat treatment is performed using a high-temperature gas. As the high-temperature gas, an inert gas which does not react by heat treatment with an object to be processed, such as nitrogen or a rare gas like argon, is used.

Note that in the heat treatment, it is preferable that moisture, hydrogen, and the like be not contained in nitrogen or a rare gas such as helium, neon, or argon. Alternatively, it is preferable that the purity of nitrogen or the rare gas such as helium, neon, or argon which is introduced into the heat treatment apparatus be set to be higher than or equal to 6N (99.9999%), more preferably higher than or equal to 7N (99.99999%) (i.e., the concentration of impurities is lower than or equal to 1 ppm, preferably lower than or equal to 0.1 ppm).

In addition, after the oxide semiconductor film 403 is heated by the heat treatment, a high-purity oxygen gas, a high-purity dinitrogen monoxide gas, or ultra dry air (the moisture amount is less than or equal to 20 ppm (−55° C. by conversion into a dew point), preferably less than or equal to 1 ppm, more preferably less than or equal to 10 ppb, in the measurement with the use of a dew point meter of a cavity ring down laser spectroscopy (CRDS) system) may be introduced into the same furnace. It is preferable that water, hydrogen, or the like be not contained in the oxygen gas or the dinitrogen monoxide gas. The purity of the oxygen gas or the dinitrogen monoxide gas which is introduced into the heat treatment apparatus is preferably higher than or equal to 6N, more preferably higher than or equal to 7N (i.e., the impurity concentration in the oxygen gas or the dinitrogen monoxide gas is preferably lower than or equal to 1 ppm, more preferably lower than or equal to 0.1 ppm). The oxygen gas or the dinitrogen monoxide gas acts to supply oxygen that is a main component of the oxide semiconductor and that is reduced by the step for removing an impurity for the dehydration or dehydrogenation, so that the oxide semiconductor film 403 can be a high-purified and i-type (intrinsic) oxide semiconductor film.

The heat treatment for dehydration or dehydrogenation may be performed plural times and may also serve as another heat treatment. The timing of the heat treatment for dehydration or dehydrogenation may be either after the formation of the oxide semiconductor film or after the formation of the island-shaped oxide semiconductor film 403 or both.

By the heat treatment performed after the formation of the oxide semiconductor film 403, hydrogen is released from the first gate insulating film 436 that is a silicon nitride film and bonds to oxygen in the oxide semiconductor film 403 during passing through the oxide semiconductor film 403, whereby $H_2O$ is released to the outside of the oxide semiconductor film 403. This is indicated by the experiments described below.

Figure 12A:
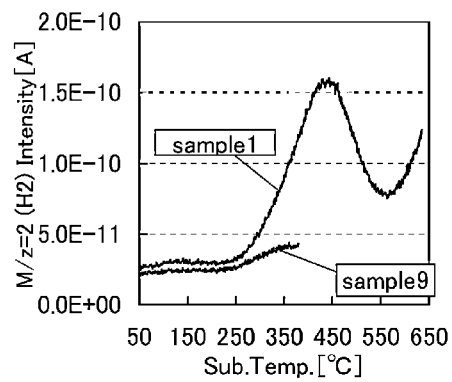
FIGS. 12A to 12C are graphs showing the results of TDS measurement.
Figure 12B:
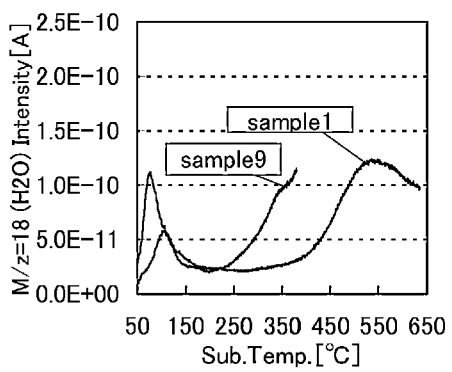
Figure 12C:
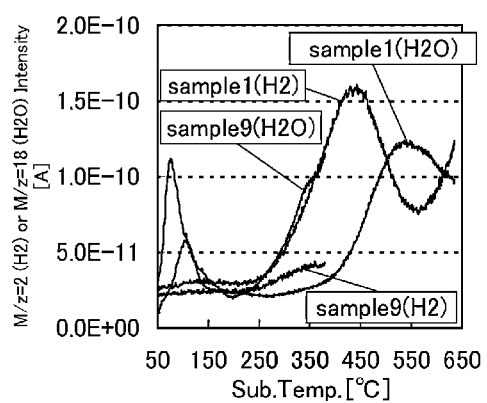

TDS measurement was performed on Sample 9 formed by stacking a 50-nm-thick silicon nitride film, a 200-nm-thick silicon oxynitride film, and a 35-nm-thick IGZO film over a silicon substrate, and FIGS. 12A to 12C show the results. Note that Sample 9 contains Zn, and the measurement was performed up to 400° C. in order to prevent damage to a TDS apparatus caused by sublimation of Zn. For comparison, FIG. 12A shows the amount of released hydrogen of Sample 1, and FIG. 12B shows the amount of released $H_2O$ of Sample 1.

The silicon nitride film of Sample 9 was formed under the following conditions: flow rate of a silane gas, 90 sccm; flow rate of a nitrogen gas, 4000 sccm; flow rate of an $NH_3$ gas, 2700 sccm; RF power, 2000 W; deposition pressure, 200 Pa; and substrate temperature, 350° C. The silicon oxynitride film of Sample 9 was formed under the following conditions: flow rate of a silane gas, 20 sccm; flow rate of an $N_2O$, 3000 sccm; RF power, 100 W; deposition pressure, 40 Pa; and substrate temperature, 350° C. The IGZO film of Sample 9 was formed under the following conditions: atmosphere, an oxygen gas and an argon gas (the flow rate of oxygen: 50%); pressure, 0.6 Pa; electric power, 5 kW; and substrate temperature, 170° C.

As seen from FIG. 12A, the amount of released hydrogen of Sample 9 is smaller than that of Sample 1. As seen from FIG. 12B, the amount of released $H_2O$ of Sample 9 is larger than that of Sample 1. The results shown in FIGS. 12A and 12B are overlapped with each other in FIG. 12C. According to FIG. 12C, the amount of released hydrogen of Sample 1 substantially corresponds to the amount of released $H_2O$ of Sample 9. The following can be confirmed by this finding: by the heat treatment performed after the formation of the oxide semiconductor film 403, hydrogen is released from the first gate insulating film 436 that is a silicon nitride film and bonds to oxygen in the oxide semiconductor film 403 during passing through the oxide semiconductor film 403, whereby $H_2O$ is released to the outside of the oxide semiconductor film 403. These together indicate that it is important for the transistor including the oxide semiconductor film 403 to reduce the hydrogen content in the first gate insulating film 436 or the amount of hydrogen released from the first gate insulating film 436, and by this reduction, the reliability of the transistor can be improved.

Next, a conductive film to be the source electrode layer and the drain electrode layer (including a wiring formed in the same layer as the source electrode layer and the drain electrode layer) is formed over the gate electrode layer 401, the second gate insulating film 402, and the oxide semiconductor film 403.

The conductive film is formed using a material that can withstand heat treatment in a later step. As the conductive film used for the source electrode layer and the drain electrode layer, it is possible to use, for example, a metal film containing an element selected from Al, Cr, Cu, Ta, Ti, Mo, and W, a metal nitride film containing any of these elements as its component (e.g., a titanium nitride film, a molybdenum nitride film, or a tungsten nitride film), or the like. A metal film having a high melting point such as Ti, Mo, W, or the like or a metal nitride film of any of these elements (e.g., a titanium nitride film, a molybdenum nitride film, or a tungsten nitride film) may be stacked on one of or both of a lower side and an upper side of a metal film of Al, Cu, or the like. Alternatively, the conductive film used for the source electrode layer and the drain electrode layer may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$, abbreviated to ITO), indium oxide-zinc oxide ($In_2O_3$—ZnO), or any of these metal oxide materials in which silicon oxide is contained can be used.

Figure 2D:
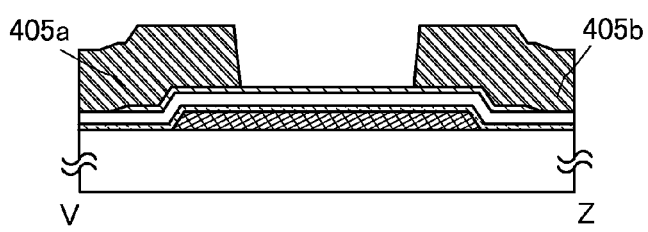

Through a photolithography process, a resist mask is formed over the conductive film, and the source electrode layer 405a and the drain electrode layer 405b are formed by selective etching (see FIG. 2D). After the source electrode layer 405a and the drain electrode layer 405b are formed, the resist mask is removed.

To reduce the number of photomasks used in the photolithography process and reduce the number of photolithography processes, an etching step may be performed with the use of a multi-tone mask which is a light-exposure mask through which light is transmitted to have a plurality of intensities. A resist mask formed with the use of a multi-tone mask has a plurality of thicknesses and further can be changed in shape by etching; therefore, the resist mask can be used in a plurality of etching steps for processing into different patterns. Therefore, a resist mask corresponding to at least two kinds of different patterns can be formed by one multi-tone mask. Thus, the number of light-exposure masks can be reduced and the number of corresponding photolithography processes can also be reduced, whereby the process can be simplified.

In this embodiment, the conductive film can be etched using a gas containing chlorine, for example, a gas containing chlorine ($Cl_2$), boron trichloride ($BCl_3$), silicon tetrachloride ($SiCl_4$), or carbon tetrachloride ($CCl_4$). Alternatively, a gas containing fluorine, for example, a gas containing carbon tetrafluoride ($CF_4$), sulfur hexafluoride ($SF_6$), nitrogen trifluoride ($NF_3$), or trifluoromethane ($CHF_3$) can be used. Alternatively, any of these gases to which a rare gas such as helium (He) or argon (Ar) is added, or the like can be used.

As the etching method, a parallel plate reactive ion etching (RIE) method or an inductively coupled plasma (ICP) etching method can be used. To etch the films into desired shapes, the etching condition (the amount of electric power applied to a coil-shaped electrode, the amount of electric power applied to an electrode on a substrate side, the temperature of the electrode on the substrate side, or the like) is adjusted as appropriate.

In this embodiment, as the conductive film, a stack of a titanium film with a thickness of 100 nm, an aluminum film with a thickness of 400 nm, and a titanium film with a thickness of 100 nm which are formed by a sputtering method is used. As the etching of the conductive film, the stack of the titanium film, the aluminum film, and the titanium film is etched by a dry etching method, and the source electrode layer 405a and the drain electrode layer 405b are formed.

In this embodiment, the upper titanium film and the aluminum film are etched under first etching conditions and then the lower titanium film is etched under second etching conditions. The first etching conditions are as follows: etching gas, $BCl_3$:$Cl_2$=750 sccm:150 sccm; bias power, 1500 W; ICP power, 0 W; and pressure, 2.0 Pa. The second etching conditions are as follows: etching gas, $BCl_3$:$Cl_2$=700 sccm:100 sccm; bias power, 750 W; ICP power, 0 W; and pressure, 2.0 Pa.

Note that it is preferable that etching conditions be optimized so as not to etch and divide the oxide semiconductor film 403 when the conductive film is etched. However, it is difficult to obtain etching conditions in which only the conductive film is etched and the oxide semiconductor film 403 is not etched at all. In some cases, part of the oxide semiconductor film 403 is etched off through the etching of the conductive film, so that an oxide semiconductor film having a groove (depressed portion) is formed.

Through the above-described process, the transistor 440 of this embodiment is formed.

Figure 2E:
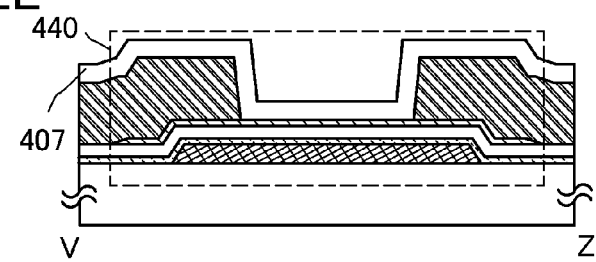

In this embodiment, the insulating film 407 is formed over the source electrode layer 405a and the drain electrode layer 405b and in contact with the oxide semiconductor film 403 (see FIG. 2E). After the formation of the insulating film 407, heat treatment is performed under a nitrogen atmosphere at 300° C. for one hour.

The insulating film 407 can be formed with a thickness of at least 1 nm by a method by which impurities such as water and hydrogen do not enter the insulating film 407, such as a sputtering method, as appropriate. When hydrogen is contained in the insulating film 407, entry of the hydrogen to the oxide semiconductor film 403, or extraction of oxygen from the oxide semiconductor film by hydrogen may occur, in which case the back channel in the oxide semiconductor film 403 may have lower resistance (become n-type), so that a parasitic channel might be formed. Therefore, it is important that a film formation method in which hydrogen is not used is employed in order to form the insulating film 407 containing as little hydrogen as possible.

As the insulating film 407, a single layer or a stack of one or more inorganic insulating films, typical examples of which are a silicon oxide film, a silicon oxynitride film, an aluminum oxide film, an aluminum oxynitride film, a hafnium oxide film, a gallium oxide film, a silicon nitride film, an aluminum nitride film, a silicon nitride oxide film, and an aluminum nitride oxide film, can be used.

Oxygen is preferably supplied to the oxide semiconductor film 403 when the heating step for a dehydration or dehydrogenation treatment is performed. By supply of oxygen to the oxide semiconductor film 403, oxygen vacancies in the film can be repaired.

In this embodiment, oxygen is supplied to the oxide semiconductor film 403 using the insulating film 407 as a supply source, and thus an example in which an oxide insulating film containing oxygen (e.g., a silicon oxide film or a silicon oxynitride film) is used as the insulating film 407 is described. In the case where the insulating film 407 is used as a supply source of oxygen, the insulating film 407 can favorably function as the supply source of oxygen when being a film containing much (excessive) oxygen (preferably, a film including a region containing oxygen in excess of the stoichiometric composition of an oxide semiconductor in a crystalline state).

In this embodiment, as the insulating film 407, a silicon oxide film with a thickness of 400 nm is formed by a sputtering method. The substrate temperature in film formation may be higher than or equal to room temperature and lower than or equal to 300° C., and in this embodiment is room temperature. The silicon oxide film can be formed by a sputtering method in a rare gas (typically, argon) atmosphere, an oxygen atmosphere, or a mixed atmosphere containing a rare gas and oxygen. As a target, a silicon oxide target or a silicon target can be used. For example, with the use of a silicon target, a silicon oxide film can be formed by a sputtering method in an atmosphere containing oxygen.

To remove the residual moisture from the deposition chamber of the insulating film 407 in a manner similar to that of the formation of the oxide semiconductor film 403, an entrapment vacuum pump (such as a cryopump) is preferably used. When the insulating film 407 is deposited in the deposition chamber evacuated using a cryopump, the impurity concentration of the insulating film 407 can be reduced. As an evacuation unit for removing the residual moisture in the deposition chamber of the insulating film 407, a turbo molecular pump provided with a cold trap may be used.

It is preferable that a high-purity gas in which an impurity such as hydrogen or water is reduced be used as the sputtering gas for the formation of the insulating film 407.

Next, the oxide semiconductor film 403 part of which (a channel formation region) is in contact with the insulating film 407 is subjected to a heating step.

The heating step is performed at a temperature higher than or equal to 250° C. and lower than or equal to 700° C., preferably higher than or equal to 400° C. and lower than or equal to 700° C., or lower than the strain point of the substrate. For example, the substrate is introduced into an electric furnace which is one of heat treatment apparatuses, and the heating step is performed on the oxide semiconductor film 403 at 300° C. in a nitrogen atmosphere for one hour.

The oxide semiconductor film 403 and the insulating film 407 containing oxygen are in contact with each other when being subjected to the heating step; thus, oxygen that is one of the main components of the oxide semiconductor film 403 and that is reduced by the step for removing an impurity can be supplied from the insulating film 407 containing oxygen to the oxide semiconductor film 403.

Alternatively, a dense inorganic insulating film may be provided over the insulating film 407. For example, an aluminum oxide film is formed over the insulating film 407 by a sputtering method. Providing an aluminum oxide film having high density (film density: 3.2 g/cm$^3$ or higher, preferably 3.6 g/cm$^3$ or higher) can stabilize the electric characteristics of the transistor 440. The film density can be measured by Rutherford backscattering spectrometry (RBS) or X-ray reflection (XRR).

The aluminum oxide film which can be used as the insulating film 407 provided over the transistor 440 has a high shielding effect (blocking effect) of preventing penetration of both oxygen and an impurity such as hydrogen or moisture through the film.

Therefore, during the manufacturing process and after the manufacture, the aluminum oxide film functions as a protective film for preventing entry of an impurity such as hydrogen or moisture which might cause variation in electric characteristics into the oxide semiconductor film 403, and release of oxygen which is a main component material of the oxide semiconductor from the oxide semiconductor film 403.

Further, a planarization insulating film may be formed thereover in order to reduce surface roughness due to the transistor 440. As the planarization insulating film, an organic material such as a polyimide resin, an acrylic resin, or a benzocyclobutene-based resin can be used. Other than such organic materials, it is also possible to use a low dielectric constant material (low-k material) or the like. Note that the planarization insulating film may be formed by stacking a plurality of insulating films formed from these materials.

For example, an acrylic resin film with a thickness of 1500 nm is formed as the planarization insulating film. The acrylic resin film can be formed in such a manner that the top surface of the transistor 440 is coated with an acrylic resin by a coating method and then baking (e.g., at 250° C. in a nitrogen atmosphere for one hour) is performed.

Heat treatment may be performed after the planarization insulating film is formed. For example, the heat treatment is performed at 250° C. in a nitrogen atmosphere for one hour.

After the formation of the transistor 440 as described above, heat treatment may be performed. The heat treatment may be performed more than once.

By reducing the amount of a hydrogen gas released from the first gate insulating film 436 which causes deterioration or variations in electric characteristics of the transistor 440, the transistor 440 can have stable electric characteristics.

Figure 13:
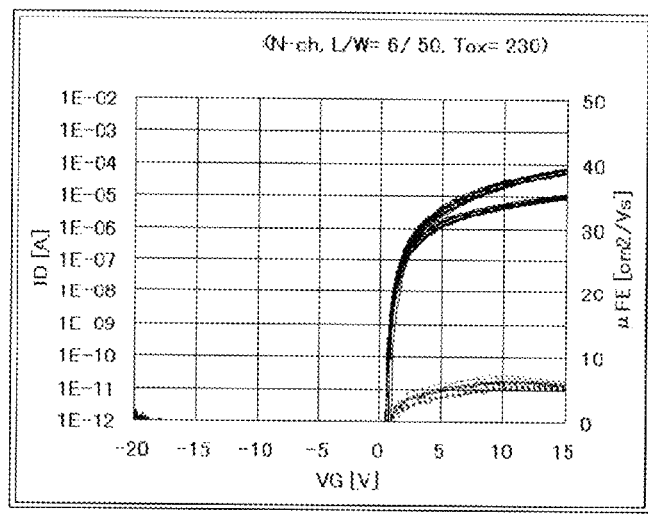
FIG. 13 is a graph showing initial characteristics of a transistor.
Figure 14A:
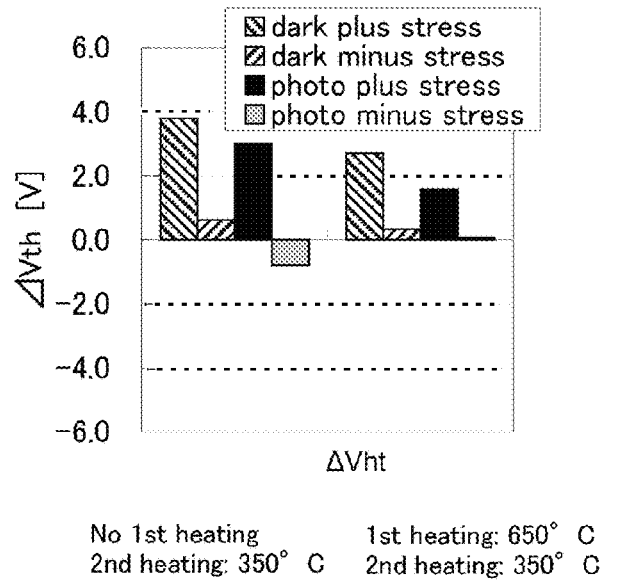
FIGS. 14A and 14B are graphs showing the results obtained by measuring the reliability of transistors.
Figure 14B:
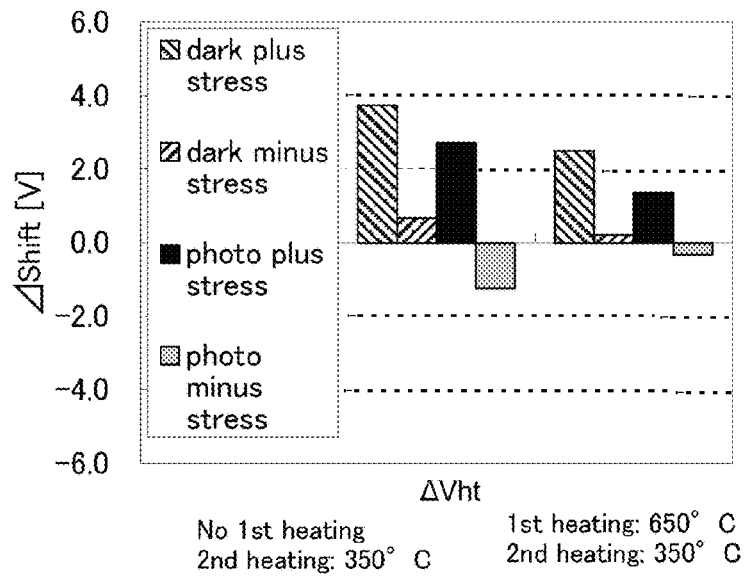

A transistor was actually manufactured in accordance with the above-described order of steps, and FIG. 13 shows the initial characteristics of the transistor. Seen from FIG. 13, a normally-off transistor can be achieved. A BT test was performed to measure the reliability of the transistor, and FIGS. 14A and 14B show the results of the test.

The BT test is one kind of acceleration test and can evaluate change in characteristics, caused by long-term usage, of thin film transistors in a short time. In particular, the amount of change in threshold voltage of the thin film transistor between before and after the BT test is an important indicator for examining the reliability. Between before and after the BT test, the smaller amount of change in threshold voltage means higher reliability.

Specifically, the temperature of a substrate over which a thin film transistor is formed (substrate temperature) is set at fixed temperature, the potentials of a source and a drain of the transistor are set to be equal, and a potential different from those of the source and the drain is applied to a gate for a certain period. The substrate temperature may be set as appropriate depending on the test purpose. The test in the case where the potential applied to the gate is higher than the potentials of the source and the drain is referred to as a positive BT test, and the test in the case where the potential applied to the gate is lower than the potentials of the source and the drain is referred to as a negative BT test.

The stress conditions for the BT test can be determined by setting the substrate temperature, the electric field intensity applied to a gate insulating film, or the time period of application of an electric field. The electric field intensity applied to a gate insulating film can be determined by dividing the potential difference between the gate potential and the source and drain potential by the thickness of the gate insulating film. For example, in order that the electric field intensity applied to the 100-nm-thick gate insulating film is set to 2 MV/cm, the potential difference may be set to 20 V.

Note that "voltage" indicates a difference between potentials of two points, and "potential" indicates electrostatic energy (electric potential energy) of a unit charge at a given point in an electrostatic field. Note that in general, a difference between a potential of one point and a reference potential (e.g., a ground potential) is merely called potential or voltage, and potential and voltage are used as synonymous words in many cases. Therefore, in this specification, potential may be rephrased as voltage and voltage may be rephrased as potential unless otherwise specified.

A transistor with a size of L/W=6 μm/50 μm was used, and stress conditions in a dark environment were as follows: Vg=−30 V to +30 V (electric field intensity: 3 MV/cm); Vd=Vs=0 V; the stress temperature: 80° C.; and the time period of application (also referred to as stress time): 2000 seconds.

A comparative transistor was manufactured by the same process except that the first heat treatment (heat treatment at 650° C.) after the formation of the second gate insulating film was not performed on the comparative transistor. FIGS. 14A and 14B also show the results obtained by measuring the reliability of the comparative transistor. FIG. 14A and FIG. 14B show variations in threshold ($\Delta$Vth) and variations in shift value ($\Delta$Shift), respectively, after stress application where Vd=5 V for 2000 seconds. Note that in a curve where the horizontal axis and the vertical axis indicate the gate voltage (Vg [V]) and the logarithm of drain current (Id [A]), respectively, the shift value (Shift) is defined as a gate voltage at a point of intersection of an extrapolated tangent line of Id having the highest inclination with a straight line of Id=1.0× $10^{-12}$ [A].

By the positive BT test in the dark environment, the threshold voltage of the transistor subjected to the first heat treatment shifts in the positive direction by 2.7 V from that of its initial characteristics (right side of the graphs shown in FIG. 14A). This change is smaller than that of the comparative transistor the threshold voltage of which shifts in the positive direction by 3.8 V (left side of the graphs shown in FIG. 14A). By the negative BT test in the dark environment, the threshold voltage of the transistor subjected to the first heat treatment shifts in the positive direction by 0.34 V from that of its initial characteristics. This change is smaller than that of the comparative transistor the threshold voltage of which shifts in the positive direction by 0.62 V. These results indicate that in the BT tests in the dark environment, the transistor with the first heat treatment has higher reliability than the transistor without being with the first heat treatment.

Furthermore, the positive BT test and the negative BT test were performed with light irradiation using an LED light source (white light with an illuminance of about 3000 lux), and the results are shown in FIGS. 14A and 14B.

By the positive BT test with light irradiation, the threshold voltage of the transistor subjected to the first heat treatment shifts in the positive direction by 1.58 V from that of its initial characteristics (right side of the graphs shown in FIG. 14B). This change is smaller than that of the comparative transistor the threshold voltage of which shifts in the positive direction by 3.01 V (left side of the graphs shown in FIG. 14B). By the negative BT test with light irradiation, the threshold voltage of the transistor with the first heat treatment shifts in the positive direction by 0.06 V from that of its initial characteristics. This change is smaller than that of the comparative transistor the threshold voltage of which shifts in the negative direction by 0.79 V. These results indicate that in the BT tests with light irradiation, the transistor with the first heat treatment has higher reliability than the transistor without being with the first heat treatment.

Furthermore, FIG. 14B shows a large difference ($\Delta$shift) in a rising portion of the Vg-Id curve in the case where their respective Vg-Id curves are compared with each other. The transistor characteristics in such a rising portion are important particularly in a device which is greatly affected by the value of off-state current. The shift value, which is one characteristic value of the transistor in a rising portion, means a voltage value at a rising of the Vg-Id curve and corresponds to a voltage at Id which is lower than or equal to $1\times10^{-12}$ A. Also in terms of the $\Delta$shift, the transistor with the first heat treatment has higher reliability than the transistor without being with the first heat treatment.

Embodiment 2

In this embodiment, another embodiment of a semiconductor device and a method for manufacturing the semiconductor device will be described with reference to FIGS. 3A and 3B. The same portion as or a portion having a function similar to those in the above embodiment can be formed in a manner similar to that described in the above embodiment, and also the steps similar to those in the above embodiment can be performed in a manner similar to that described in the above embodiment, and repetitive description is omitted. In addition, detailed description of the same portions is not repeated.

Figure 3A:
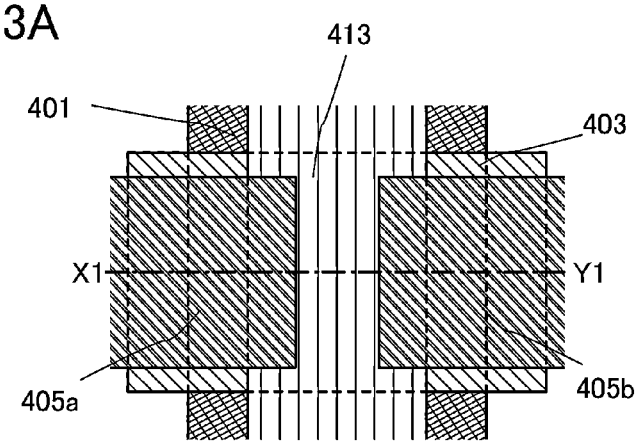
FIGS. 3A and 3B are a plan view and a cross-sectional view which illustrate one embodiment of a semiconductor device.
Figure 3B:
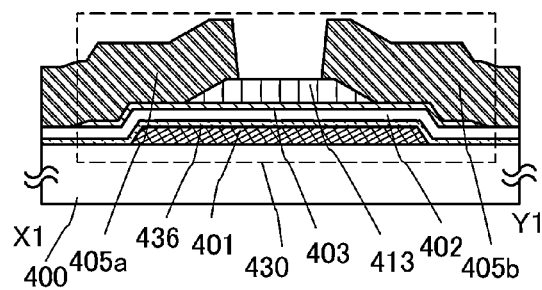

A transistor 430 illustrated in FIGS. 3A and 3B is an example of a transistor which is a kind of bottom-gate transistor referred to as a channel-protective transistor (also referred to as channel-stop transistor) and is also referred to as inverted-staggered transistor. FIG. 3A is a plan view, and FIG. 3B is a cross-sectional view taken along the chain line X1-Y1 in FIG. 3A.

As illustrated in FIG. 3B which is the cross-sectional view of the transistor 430 in the channel length direction, a semiconductor device including the transistor 430 includes, over the substrate 400, the gate electrode layer 401 and the first gate insulating film 436 which is provided so as to cover the gate electrode layer 401; and the second gate insulating film 402, the oxide semiconductor film 403, the source electrode layer 405a, and the drain electrode layer 405b which are provided over the first gate insulating film 436. Furthermore, an insulating layer 413 which is in contact with the oxide semiconductor film 403 is provided.

The first gate insulating film 436 and the second gate insulating film 402 are at least provided between the gate electrode layer 401 and the oxide semiconductor film 403. The first gate insulating film 436 provided on the gate electrode layer 401 side and the second gate insulating film 402 provided on the oxide semiconductor film 403 side have different compositions.

A nitride insulating film obtained by a plasma CVD method is used as the first gate insulating film 436. Examples of the nitride insulating film include a silicon nitride film, a silicon nitride oxide film, and a metal nitride insulating film (e.g., an aluminum nitride film or an aluminum nitride oxide film). The thickness of the first gate insulating film 436 can be greater than or equal to 20 nm and less than or equal to 350 nm. The first gate insulating film 436 may have a single-layer structure or a layered structure.

The insulating layer 413 in contact with the oxide semiconductor film 403 is provided over a channel formation region of the oxide semiconductor film 403, which overlaps with the gate electrode layer 401, and functions as a channel protective film.

The cross-sectional shape of the insulating layer 413 which is over and overlaps with the channel formation region, specifically, the cross-sectional shape (e.g., taper angle and thickness) of an end portion of the insulating layer 413 is adjusted, so that electric-field concentration which might occur in the vicinity of an end portion of the drain electrode layer 405b can be reduced and degradation of the switching characteristics of the transistor 430 can be suppressed.

Specifically, the cross-sectional shape of the insulating layer 413 which is over and overlaps with the channel formation region is set to a trapezoid or a triangle, and the taper angle of a lower end portion of the cross-sectional shape is set to be less than or equal to 60°, preferably less than or equal to 45°, further preferably less than or equal to 30°. Setting the taper angle within such a range makes it possible to reduce the electric-field concentration which might occur in the vicinity of the end portion of the drain electrode layer 405b when a high gate voltage is applied to the gate electrode layer 401.

The thickness of the insulating layer 413 which is over and overlaps with the channel formation region is less than or equal to 0.3 μm, preferably greater than or equal to 5 nm and less than or equal to 0.1 μm. Setting the thickness within such a range makes it possible to reduce the peak of electric-field intensity, or distribute the electric-field concentration so that the electric-field is concentrated in plural portions, consequently reducing the electric-field concentration which might occur in the vicinity of the end portion of the drain electrode layer 405b.

An example of a method for manufacturing the semiconductor device including the transistor 430 will be described below.

A conductive film is formed over the substrate 400 having an insulating surface and is etched into the gate electrode layer 401. In this embodiment, a 100-nm-thick tungsten film is formed by a sputtering method.

Next, the first gate insulating film 436 is provided so as to cover the gate electrode layer 401.

As the first gate insulating film 436, a nitride insulating film formed by a plasma-enhanced CVD method, a sputtering method, or the like can be used. Examples of the nitride insulating film include a silicon nitride film and a silicon nitride oxide film. The first gate insulating film 436 may have a single-layer structure or a layered structure.

In this embodiment, as the first gate insulating film 436, a 30-nm-thick silicon nitride film formed by a plasma CVD method is used.

The second gate insulating film 402 is formed over the first gate insulating film 436. In this embodiment, a 300-nm-thick silicon oxynitride film is formed by a plasma CVD method.

Heat treatment is performed between the formation of the second gate insulating film 402 and formation of an oxide semiconductor film. Here, heat treatment was performed with a GRTA apparatus at 650° C. for six minutes to release hydrogen in the first gate insulating film 436.

After the heat treatment, the oxide semiconductor film 403 is formed over the second gate insulating film 402. Note that in this embodiment, as the oxide semiconductor film 403, a 35-nm-thick IGZO film is formed by a sputtering method with a sputtering apparatus including an AC power supply device.

For removal (dehydration or dehydrogenation) of excess hydrogen (including water and a hydroxyl group), the oxide semiconductor film 403 may be subjected to heat treatment. In this embodiment, the substrate is introduced into an electric furnace which is one of heat treatment apparatuses, and the oxide semiconductor film 403 is subjected to heat treatment at 450° C. in a nitrogen atmosphere for one hour and then subjected to another heat treatment at 450° C. in an atmosphere containing nitrogen and oxygen for one hour.

Next, the insulating layer 413 is formed over the channel formation region of the oxide semiconductor film 403, which overlaps with the gate electrode layer 401.

The insulating layer 413 can be formed by etching an insulating film formed by a plasma CVD method or a sputtering method. As the insulating layer 413, a single layer or a stack of one or more inorganic insulating films can be used. Typical examples of the inorganic insulating films include a silicon oxide film, a silicon oxynitride film, an aluminum oxide film, an aluminum oxynitride film, a hafnium oxide film, a gallium oxide film, a silicon nitride film, an aluminum nitride film, a silicon nitride oxide film, and an aluminum nitride oxide film.

When the insulating layer 413 in contact with the oxide semiconductor film 403 (or a film in contact with the oxide semiconductor film 403 in the case where the insulating layer 413 has a layered structure) contains much oxygen, the insulating layer 413 (or the film in contact with the oxide semiconductor film 403) can favorably function as a supply source which supplies oxygen to the oxide semiconductor film 403.

After the formation of the insulating layer 413, heat treatment may be performed. In this embodiment, the heat treatment is performed in a nitrogen atmosphere at 300° C. for one hour.

Next, a conductive film to be the source electrode layer and the drain electrode layer is formed over the gate electrode layer 401, the first gate insulating layer 436, the second gate insulating film 402, the oxide semiconductor film 403, and the insulating layer 413.

In this embodiment, as the conductive film, a stack of a 100-nm-thick titanium film, a 400-nm-thick aluminum film, and a 100-nm-thick titanium film is formed by a sputtering method. As the etching of the conductive film, the stack of the titanium film, the aluminum film, and the titanium film is etched by a dry etching method, whereby the source electrode layer 405a and the drain electrode layer 405b are formed.

Through the above-described process, the transistor 430 of this embodiment is formed.

An insulating film may be formed over the source electrode layer 405a and the drain electrode layer 405b.

The insulating film can be formed using a material and a method similar to those of the insulating layer 413. For example, a 400-nm-thick silicon oxynitride film is formed by a CVD method. After the formation of the insulating film, heat treatment may be performed. For example, the heat treatment is performed in a nitrogen atmosphere at 300° C. for one hour.

Furthermore, a planarization insulating film may be formed thereover in order to reduce surface roughness due to the transistor 430.

For example, a 1500-nm-thick acrylic resin film is formed over the insulating film as the planarization insulating film. The acrylic resin film can be formed in such a manner that an acrylic resin is applied by a coating method and then baked (e.g., in a nitrogen atmosphere at 250° C. for one hour).

After the formation of the planarization insulating film, heat treatment may be performed. For example, the heat treatment is performed in a nitrogen atmosphere at 250° C. for one hour.

After the formation of the transistor 430 as described above, heat treatment may be performed. The heat treatment may be performed more than once.

By reducing the amount of a hydrogen gas released from the first gate insulating film 436 which causes deterioration or variations in electric characteristics of the transistor 430, the transistor 430 can have stable electric characteristics.

Consequently, a highly reliable semiconductor device which includes the transistor 430 including the oxide semiconductor film 403 and having stable electric characteristics can be provided. Further, the highly reliable semiconductor device can be manufactured at a high yield, whereby high productivity is achieved.

Embodiment 3

In this embodiment, another embodiment of a semiconductor device and a method for manufacturing the semiconductor device will be described with reference to FIGS. 4A and 4B. The same portion as or a portion having a function similar to those in the above embodiment can be formed in a manner similar to that described in the above embodiment, and also the steps similar to those in the above embodiment can be performed in a manner similar to that described in the above embodiment, and repetitive description is omitted. In addition, detailed description of the same portions is not repeated.

Figure 4A:
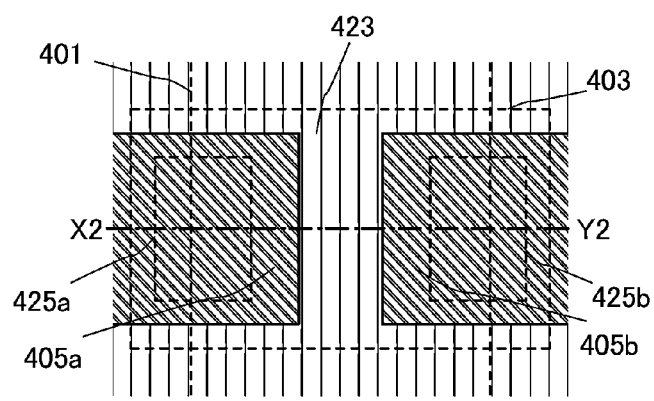
FIGS. 4A and 4B are a plan view and a cross-sectional view which illustrate one embodiment of a semiconductor device.
Figure 4B:
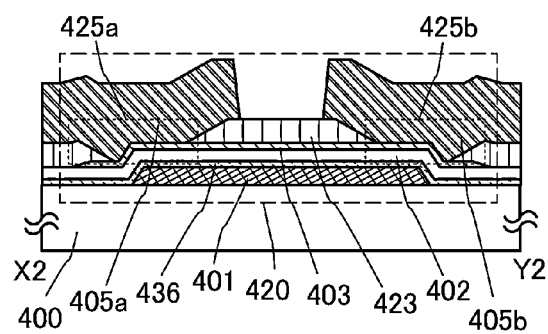

A transistor 420 illustrated in FIGS. 4A and 4B is an example of a transistor which is a kind of bottom-gate transistor referred to as a channel-protective transistor (also referred to as channel-stop transistor) and is also referred to as inverted-staggered transistor. FIG. 4A is a plan view, and FIG. 4B is a cross-sectional view taken along the chain line X2-Y2 in FIG. 4A.

As illustrated in FIG. 4B which is the cross-sectional view of the transistor 420 in the channel length direction, a semiconductor device including the transistor 420 includes, over the substrate 400, the gate electrode layer 401 and the first gate insulating film 436 which is provided so as to cover the gate electrode layer 401; and the second gate insulating film 402, the oxide semiconductor film 403, an insulating layer 423, the source electrode layer 405a, and the drain electrode layer 405b which are provided over the first gate insulating film 436.

The insulating layer 423 is provided over a region of the oxide semiconductor film 403 including at least the channel formation region of the oxide semiconductor film 403, which overlaps with the gate electrode layer 401, and functions as a channel protective film. The insulating layer 423 includes openings 425a and 425b which reach the oxide semiconductor film 403 and whose inner walls are each covered with the source electrode layer 405a or the drain electrode layer 405b. Accordingly, the insulating layer 423 covers the periphery of the oxide semiconductor film 403 and thus functions also as an interlayer insulating film. Parasitic capacitance can be reduced by locating, in addition to the second gate insulating film 402, the insulating layer 423 as an interlayer insulating film at the intersection of a gate wiring and a source wiring.

In the transistor 420, the oxide semiconductor film 403 is covered with the insulating layer 423, the source electrode layer 405a, and the drain electrode layer 405b.

The insulating layer 423 can be formed by etching an insulating film formed by a plasma CVD method or a sputtering method. Inner walls of the openings 425a and 425b in the insulating layer 423 are tapered.

The insulating layer 423 is provided over a region of the oxide semiconductor film 403 including at least the channel formation region of the oxide semiconductor film 403, which overlaps with the gate electrode layer 401, and partly functions as a channel protective film.

The first gate insulating film 436 and the second gate insulating film 402 are at least provided between the gate electrode layer 401 and the oxide semiconductor film 403. The first gate insulating film 436 provided on the gate electrode layer 401 side and the second gate insulating film 402 provided on the oxide semiconductor film 403 side have different compositions.

A nitride insulating film obtained by a plasma CVD method is used as the first gate insulating film 436. For example, a silicon nitride film, a silicon nitride oxide film, and a metal nitride insulating film (e.g., an aluminum nitride film and an aluminum nitride oxide film) are given. The thickness of the first gate insulating film 436 can be greater than or equal to 20 nm and less than or equal to 350 nm. The first gate insulating film 436 may have a single-layer structure or a layered structure.

The thickness of the insulating layer 423 which is over and overlaps with the channel formation region is less than or equal to 0.3 μm, preferably greater than or equal to 5 nm and less than or equal to 0.1 μm. Setting the thickness within such a range makes it possible to reduce the peak of electric-field intensity, or distribute the electric-field concentration so that the electric-field is concentrated in plural portions, consequently reducing the electric-field concentration which might occur in the vicinity of the end portion of the drain electrode layer 405b.

By reducing the amount of a hydrogen gas released from the first gate insulating film 436 which causes deterioration or variations in electric characteristics of the transistor 420, the transistor 420 can have stable electric characteristics.

Consequently, a highly reliable semiconductor device which includes the transistor 420 including the oxide semiconductor film 403 and having stable electric characteristics can be provided. Furthermore, the highly reliable semiconductor device can be manufactured at a high yield, whereby high productivity can be achieved.

Embodiment 4

A semiconductor device with a display function (also referred to as display device) can be manufactured using the transistor described in any of Embodiments 1 to 3. Moreover, part or all of the driver circuit which includes the transistor can be formed over a substrate where a pixel portion is formed, whereby a system-on-panel can be formed.

Figure 5A:
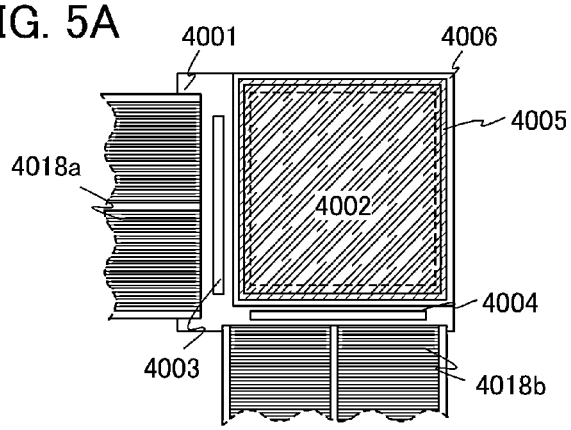
FIGS. 5A to 5C are plan views each illustrating one embodiment of a semiconductor device.

In FIG. 5A, a sealant 4005 is provided so as to surround a pixel portion 4002 provided over a substrate 4001 which is a glass substrate, and the pixel portion 4002 is sealed with a substrate 4006. In FIG. 5A, a scan line driver circuit 4004 and a signal line driver circuit 4003 which are each formed using a single crystal semiconductor film or a polycrystalline semiconductor film over an IC chip or a substrate separately prepared are mounted on the substrate 4001, in a region that is different from the region surrounded by the sealant 4005. A variety of signals and potentials are supplied to the signal line driver circuit 4003, the scan line driver circuit 4004, and the pixel portion 4002, which are separately formed, from flexible printed circuits (FPCs) 4018a and 4018b.

Figure 5B:
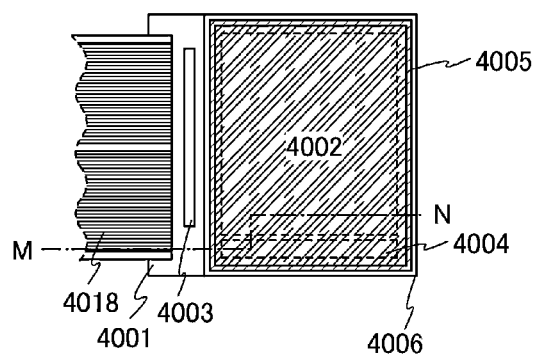
Figure 5C:
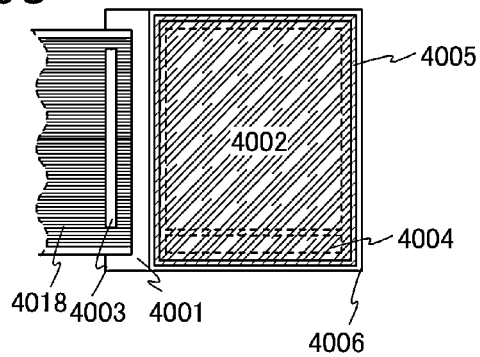

In FIGS. 5B and 5C, the sealant 4005 is provided so as to surround the pixel portion 4002 and the scan line driver circuit 4004 which are provided over the substrate 4001. The substrate 4006 is provided over the pixel portion 4002 and the scan line driver circuit 4004. Consequently, the pixel portion 4002 and the scan line driver circuit 4004 are sealed together with a display element, by the substrate 4001, the sealant 4005, and the substrate 4006. In FIGS. 5B and 5C, the signal line driver circuit 4003 which is formed using a single crystal semiconductor film or a polycrystalline semiconductor film over an IC chip or a substrate separately prepared is mounted on the substrate 4001, in a region that is different from the region surrounded by the sealant 4005. In FIGS. 5B and 5C, a variety of signals and potentials are supplied to the scan line driver circuit 4004 and the pixel portion 4002, and the signal line driver circuit 4003, which is separately formed, from an FPC 4018.

Although FIGS. 5B and 5C each illustrate an example in which the signal line driver circuit 4003 is formed separately and mounted on the substrate 4001, one embodiment of the present invention is not limited to this structure. The scan line driver circuit may be formed separately and then mounted, or only part of the signal line driver circuit or only part of the scan line driver circuit may be formed separately and then mounted.

The connection method of such a separately formed driver circuit is not particularly limited; for example, a chip on glass (COG) method, a wire bonding method, or a tape automated bonding (TAB) method can be used. FIG. 5A illustrates an example in which the signal line driver circuit 4003 and the scan line driver circuit 4004 are mounted by a COG method; FIG. 5B illustrates an example in which the signal line driver circuit 4003 is mounted by a COG method; and FIG. 5C illustrates an example in which the signal line driver circuit 4003 is mounted by a TAB method.

The display device includes in its category a panel in which a display element is sealed and a module in which an IC including a controller or the like is mounted on the panel.

The display device in this specification means an image display device, a display device, or a light source (including a lighting device). Furthermore, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion and the scan line driver circuit provided over the substrate include a plurality of transistors and transistors described in any of Embodiments 1 to 3 can be applied.

As the display element provided in the display device, a liquid crystal element (also referred to as liquid crystal display element) or a light-emitting element (also referred to as light-emitting display element) can be used. The light-emitting element includes in its category an element whose luminance is controlled by a current or a voltage, and specifically includes an inorganic electroluminescent (EL) element, an organic EL element, and the like. A display medium whose contrast is changed by an electric effect, such as electronic ink, can also be used.

Embodiments of the semiconductor device are described with reference to FIGS. 5A to 5C, FIGS. 6A and 6B, and FIGS. 7A and 7B. FIGS. 7A and 7B are cross-sectional views taken along the line M-N of FIG. 5B.

As illustrated in FIGS. 5A to 5C and FIGS. 7A and 7B, the semiconductor device includes a connection terminal electrode 4015 and a terminal electrode 4016, and the connection terminal electrode 4015 and the terminal electrode 4016 are electrically connected to a terminal included in the FPC 4018, the FPC 4018a, or the FPC 4018b through an anisotropic conductive film 4019.

The connection terminal electrode 4015 is formed using the same conductive film as a first electrode layer 4030, and the terminal electrode 4016 is formed using the same conductive film as source electrode layers and drain electrode layers of a transistor 4040 and a transistor 4011.

Each of the pixel portion 4002 and the scan line driver circuit 4004 which are provided over the substrate 4001 includes a plurality of transistors. In FIGS. 7A and 7B, the transistor 4010 included in the pixel portion 4002 and the transistor 4011 included in the scan line driver circuit 4004 are illustrated as an example. An insulating film 4020 is provided over the transistors 4010 and 4011 in FIG. 7A, and an insulating film 4021 is further provided in FIG. 7B.

Any of the transistors described in Embodiments 1 to 3 can be applied to the transistors 4010 and 4011. This embodiment shows an example where a transistor having a structure similar to that of the transistor 430 described in Embodiment 2 is applied thereto. The transistors 4010 and 4011 are inverted-staggered transistors having a bottom-gate structure, in each of which an insulating layer functioning as a channel protective film is provided over an oxide semiconductor film.

Gate electrode layers of the transistors 4010 and 4011 are covered with a first gate insulating film 4023, and a second gate insulating film and an oxide semiconductor film of the transistors 4010 and 4011 are protected from contamination caused by a metal element contained in the substrate 4001. Furthermore, by reducing the amount of a hydrogen gas released from the first gate insulating film 436 which causes deterioration or variations in electric characteristics of the transistors 4010 and 4011, the transistors 4010 and 4011 can have stable electric characteristics.

The first gate insulating film 4023 can be formed using a nitride insulating film. In this embodiment, as the first gate insulating film 4023, a silicon nitride film is used.

Consequently, highly reliable semiconductor devices can be provided as semiconductor devices which include the transistors 4010 and 4011 each including the oxide semiconductor film and having stable electric characteristics, which are illustrated in FIGS. 7A and 7B in this embodiment. Furthermore, the highly reliable semiconductor device can be manufactured at high yield, whereby high productivity can be achieved.

A conductive layer may be further provided to overlap with the channel formation region in the oxide semiconductor film of the transistor 4011 for the driver circuit. By providing the conductive layer to overlap with the channel formation region in the oxide semiconductor film, the amount of change in the threshold voltage of the transistor 4011 between before and after a bias-temperature stress test (BT test) can be further reduced. The conductive layer may have a potential the same as or a potential different from that of the gate electrode layer of the transistor 4011, and can function as a second gate electrode layer. The potential of the conductive layer may be GND or 0 V, or the conductive layer may be in a floating state.

The conductive layer also has the function of blocking an external electric field, that is, the function of preventing an external electric field (particularly, static electricity) from effecting the inside (a circuit portion including a transistor). A blocking function of the conductive layer can prevent the variation in electric characteristics of the transistor due to the effect of external electric field such as static electricity.

The transistor 4010 included in the pixel portion 4002 is electrically connected to a display element to constitute a display panel. There is no particular limitation on the kind of the display element as long as display can be performed, and various kinds of display elements can be used.

An example of a liquid crystal display device using a liquid crystal element as a display element is illustrated in FIG. 7A. In FIG. 7A, a liquid crystal element 4013 which is a display element includes the first electrode layer 4030, a second electrode layer 4031, and a liquid crystal layer 4008. An insulating film 4032 and an insulating film 4033 functioning as alignment films are provided so that the liquid crystal layer 4008 is provided therebetween. The second electrode layer 4031 is provided on the substrate 4006 side, and the first electrode layer 4030 and the second electrode layer 4031 are stacked with the liquid crystal layer 4008 provided therebetween.

A spacer 4035 is a columnar spacer obtained by selective etching of an insulating film and is provided in order to control the thickness of the liquid crystal layer 4008 (cell gap). Alternatively, a spherical spacer may be used.

In the case where a liquid crystal element is used as the display element, a thermotropic liquid crystal, a low-molecular liquid crystal, a high-molecular liquid crystal, a polymer-dispersed liquid crystal, a ferroelectric liquid crystal, an anti-ferroelectric liquid crystal, or the like can be used. Such a liquid crystal material (liquid crystal composition) exhibits a cholesteric phase, a smectic phase, a cubic phase, a chiral nematic phase, an isotropic phase, or the like depending on conditions.

Alternatively, a liquid crystal composition exhibiting a blue phase for which an alignment film is not used may be used for the liquid crystal layer 4008. In this case, the liquid crystal layer 4008 is in contact with the first electrode layer 4030 and the second electrode layer 4031. The blue phase is one of liquid crystal phases, which is generated just before a cholesteric phase changes into an isotropic phase while temperature of a cholesteric liquid crystal is increased. The blue phase can be exhibited using a liquid crystal composition which is a mixture of a liquid crystal and a chiral agent. To increase the temperature range where the blue phase is exhibited, a liquid crystal layer can be formed by adding a polymerizable monomer, a polymerization initiator, and the like to a liquid crystal composition exhibiting a blue phase and by performing polymer stabilization treatment. The liquid crystal composition exhibiting a blue phase has a short response time, and has optical isotropy, which contributes to the exclusion of the alignment process and reduction of viewing angle dependence. In addition, since an alignment film does not need to be provided and thus rubbing treatment is not necessary, electrostatic discharge damage caused by the rubbing treatment can be prevented and defects and damage of the liquid crystal display device in the manufacturing process can be reduced. Thus, the productivity of the liquid crystal display device can be improved. A transistor including an oxide semiconductor film has a possibility that the electric characteristics of the transistor may be changed significantly by the influence of static electricity and deviate from the designed range. Therefore, it is more effective to use a liquid crystal composition exhibiting a blue phase for the liquid crystal display device which includes the transistor including an oxide semiconductor film.

The specific resistivity of the liquid crystal material is greater than or equal to $1\times10^9$ Ω·cm, preferably greater than or equal to $1\times10^{11}$ Ω·cm, more preferably greater than or equal to $1\times10^{12}$ Ω·cm. The specific resistivity in this specification is measured at 20° C.

The magnitude of a storage capacitor in the liquid crystal display device is set considering the leakage current of the transistor in the pixel portion or the like so that charge can be held for a predetermined period. The magnitude of the storage capacitor may be set considering the off-state current of the transistor or the like. By using a transistor including an oxide semiconductor film disclosed in this specification, a capacitance that is ⅓ or less, preferably ⅕ or less of liquid crystal capacitance of each pixel is enough as the magnitude of the storage capacitor.

In the transistor including an oxide semiconductor film disclosed in this specification, the current in an off state (off-state current) can be controlled to be small. Accordingly, an electric signal such as an image signal can be held for a longer period, and a writing interval can be set longer in an on state. The frequency of refresh operation can be accordingly reduced, which leads to an effect of reducing power consumption.

In the transistor including an oxide semiconductor film disclosed in this specification, relatively high field-effect mobility can be obtained; thus, the transistor can operate at high speed. For example, with such a transistor which can operate at high speed used for a liquid crystal display device, a switching transistor in a pixel portion and a driver transistor in a driver circuit portion can be formed over one substrate. That is, a semiconductor device formed using a silicon wafer or the like is not additionally needed as a driver circuit, by which the number of components of the semiconductor device can be reduced. In addition, the transistor which can operate at high speed can be used also in the pixel portion, whereby a high-quality image can be provided.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an anti-ferroelectric liquid crystal (AFLC) mode, or the like can be used.

A normally black liquid crystal display device such as a transmissive liquid crystal display device utilizing a vertical alignment (VA) mode may be used. Some examples are given as the vertical alignment mode; for example, a multi-domain vertical alignment (MVA) mode, a patterned vertical alignment (PVA) mode, or an advanced super view (ASV) mode can be used. Furthermore, this embodiment can be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in the vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (light-blocking layer), an optical member (optical substrate) such as a polarizing member, a retardation member, or an anti-reflection member, and the like are provided as appropriate. For example, circular polarization may be provided by a polarizing substrate and a retardation substrate. In addition, a backlight, a side light, or the like may be used as a light source.

As a display method in the pixel portion, a progressive method, an interlace method, or the like can be employed. Furthermore, color elements controlled in a pixel at the time of color display are not limited to three colors: R, G, and B (R, G, and B correspond to red, green, and blue, respectively). For example, R, G, B, and W (W corresponds to white); or R, G, B, and one or more of yellow, cyan, magenta, and the like can be used. Furthermore, the sizes of display regions may be different between respective dots of color elements. The disclosed invention is not limited to a display device for color display; the disclosed invention can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In the organic EL element, by application of voltage to the light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to the ground state from the excited state, thereby emitting light. Such a light-emitting element is called a current-excitation light-emitting element owing to such a mechanism. In this embodiment, an example in which an organic EL element is used as the light-emitting element is described.

The inorganic EL elements are classified according to their element structures into a dispersion-type inorganic EL element and a thin-film inorganic EL element. The dispersion-type inorganic EL element has a light-emitting layer where particles of a light-emitting material are dispersed in a binder, and its light emission mechanism is donor-acceptor recombination type light emission that utilizes a donor level and an acceptor level. The thin-film inorganic EL element has a structure where a light-emitting layer is sandwiched between dielectric layers, which are further sandwiched between electrodes, and its light emission mechanism is localized type light emission that utilizes inner-shell electron transition of metal ions. An organic EL element is used as the light-emitting element for description here.

To extract light emitted from the light-emitting element, it is necessary that at least one of a pair of electrodes has a light-transmitting property. A transistor and a light-emitting element are formed over a substrate. The light-emitting element can employ any of the following emission structures: a top emission structure in which light emission is extracted through the surface opposite to the substrate; a bottom emission structure in which light emission is extracted through the surface on the substrate side; or a dual emission structure in which light emission is extracted through the surface opposite to the substrate and the surface on the substrate side.

Figure 6A:
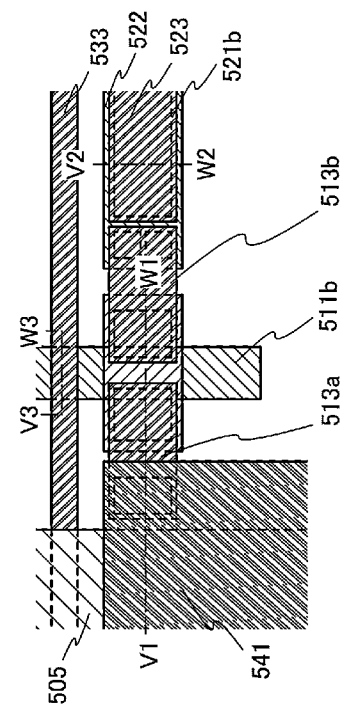
FIGS. 6A and 6B are a plan view and a cross-sectional view which illustrate one embodiment of a semiconductor device.
Figure 6B:
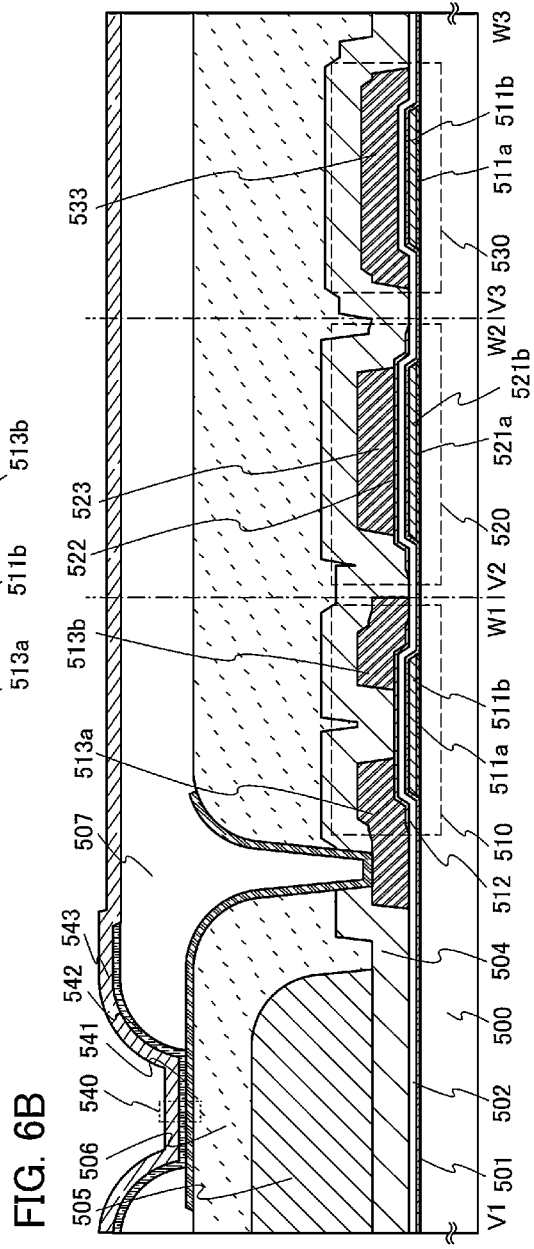

An example of a light-emitting device in which a light-emitting element is used as a display element is illustrated in FIGS. 6A and 6B and FIG. 7B.

FIG. 6A is a plan view of the light-emitting device, and FIG. 6B is a cross-sectional view taken along the chain lines V1-W1, V2-W2, and V3-W3 in FIG. 6A. Note that in the plan view in FIG. 6A, an electroluminescent layer 542 and a second electrode layer 543 are not illustrated.

The light-emitting device illustrated in FIGS. 6A and 6B includes, over a substrate 500, a transistor 510, a capacitor 520, and an intersection 530 of wiring layers. The transistor 510 is electrically connected to a light-emitting element 540. Note that FIGS. 6A and 6B illustrate a bottom-emission light-emitting device in which light from the light-emitting element 540 is extracted through the substrate 500.

Any of the transistors described in Embodiments 1 to 3 can be applied to the transistor 510. In this embodiment, an example in which a transistor having a structure similar to that of the transistor 420 described in Embodiment 3 is used is described. The transistor 510 is an inverted-staggered transistor having a bottom-gate structure in which an insulating layer functioning as a channel protective film is provided over an oxide semiconductor film.

The transistor 510 includes gate electrode layers 511a and 511b, a first gate insulating film 501, a second gate insulating film 502, an oxide semiconductor film 512, and conductive layers 513a and 513b each functioning as a source electrode layer or a drain electrode layer.

The gate electrode layers of the transistor 510 is covered with a first gate insulating film 501, and the second gate insulating film 502 and the oxide semiconductor film 512 of the transistor 510 are protected from contamination caused by a metal element contained in the substrate 500.

A nitride insulating film obtained by a plasma CVD method is used as the first gate insulating film 501. For example, a silicon nitride film, a silicon nitride oxide film, and a metal nitride insulating film (e.g., an aluminum nitride film and an aluminum nitride oxide film) are given. The thickness of the first gate insulating film 501 can be greater than or equal to 20 nm and less than or equal to 350 nm. The first gate insulating film 501 may have a single-layer structure or a layered structure. In this embodiment, a silicon nitride film obtained by a plasma CVD method is used as the first gate insulating film 501.

Consequently, a highly reliable semiconductor device can be provided as a semiconductor device which includes the transistor 510 including the oxide semiconductor film 512 and having stable electric characteristics, which is illustrated in FIGS. 6A and 6B in this embodiment. Furthermore, the highly reliable semiconductor device can be manufactured at high yield, whereby high productivity can be achieved.

The capacitor 520 includes conductive layers 521a and 521b, the second gate insulating film 502, an oxide semiconductor film 522, and a conductive layer 523. The second gate insulating film 502 and the oxide semiconductor film 522 are sandwiched between the conductive layer 523 and the conductive layers 521a and 521b, so that the capacitor is formed.

The intersection 530 of wiring layers is an intersection of a conductive layer 533 and the gate electrode layers 511a and 511b. The conductive layer 533 and the gate electrode layers 511a and 511b intersect with each other with the second gate insulating film 502 and the first gate insulating film 501 provided therebetween. In the structure described in Embodiment 3, not only the second gate insulating film 502 but also the first gate insulating film 501 can be provided between the conductive layer 533 and the gate electrode layers 511a and 511b at the intersection 530 of wiring layers; thus, parasitic capacitance between the conductive layer 533 and the gate electrode layers 511a and 511b can be reduced.

In this embodiment, a titanium film with a thickness of 30 nm is used as the gate electrode layer 511a and the conductive layer 521a, and a copper thin film with a thickness of 200 nm is used as the gate electrode layer 511b and the conductive layer 521b. Thus, the gate electrode layer has a layered structure of a titanium film and a copper thin film.

A 25-nm-thick IGZO film is used as the oxide semiconductor films 512 and 522.

An interlayer insulating film 504 is formed over the transistor 510, the capacitor 520, and the intersection 530 of wiring layers. Over the interlayer insulating film 504, a color filter layer 505 is provided in a region overlapping with the light-emitting element 540. An insulating film 506 functioning as a planarization insulating film is provided over the interlayer insulating film 504 and the color filter layer 505.

The light-emitting element 540 having a layered structure in which a first electrode layer 541, the electroluminescent layer 542, and the second electrode layer 543 are stacked in this order is provided over the insulating film 506. The first electrode layer 541 and the conductive layer 513a are in contact with each other in an opening formed in the insulating film 506 and the interlayer insulating film 504, which reaches the conductive layer 513a; thus the light-emitting element 540 and the transistor 510 are electrically connected to each other. Note that a partition 507 is provided so as to cover part of the first electrode layer 541 and the opening.

As the interlayer insulating film 504, a silicon oxynitride film with a thickness greater than or equal to 200 nm and less than or equal to 600 nm, which is formed by a plasma CVD method can be used. Further, a 1500-nm-thick photosensitive acrylic film and a 1500-nm-thick photosensitive polyimide film can be used as the insulating film 506 and the partition 507, respectively.

As the color filter layer 505, for example, a chromatic light-transmitting resin can be used. As such a chromatic light-transmitting resin, a photosensitive organic resin or a non-photosensitive organic resin can be used. A photosensitive organic resin layer is preferably used, because the number of resist masks can be reduced, leading to simplification of a process.

Chromatic colors are colors except achromatic colors such as black, gray, and white. The color filter layer is formed using a material which transmits only light of the chromatic color. As chromatic color, red, green, blue, or the like can be used. Cyan, magenta, yellow, or the like may also be used. "Transmitting only light of the chromatic color" means that the light transmitted through the color filter layer has a peak at a wavelength of light of the chromatic color. The thickness of the color filter layer may be controlled to be optimal as appropriate in consideration of the relationship between the concentration of a coloring material to be contained and the transmittance of light. For example, the thickness of the color filter layer 505 may be greater than or equal to 1500 nm and less than or equal to 2000 nm.

In the light-emitting device illustrated in FIG. 7B, a light-emitting element 4513 which is a display element is electrically connected to the transistor 4010 provided in the pixel portion 4002. A structure of the light-emitting element 4513 is not limited to the illustrated layered structure including the first electrode layer 4030, an electroluminescent layer 4511, and the second electrode layer 4031. The structure of the light-emitting element 4513 can be changed as appropriate depending on a direction in which light is extracted from the light-emitting element 4513, or the like.

A partition 4510 and the partition 507 are formed using an organic insulating material or an inorganic insulating material. It is particularly preferable that the partition 4510 and the partition 507 be formed using a photosensitive resin material to have openings over the first electrode layer 4030 and the first electrode layer 541, respectively, so that a sidewall of each opening is formed as a tilted surface with continuous curvature.

The electroluminescent layers 4511 and 542 may be formed using either a single layer or a plurality of layers stacked.

A protective film may be formed over the second electrode layer 4031 and the partition 4510 and over the second electrode layer 543 and the partition 507 in order to prevent entry of oxygen, hydrogen, moisture, carbon dioxide, or the like into the light-emitting elements 4513 and 540. As the protective film, a silicon nitride film, a silicon nitride oxide film, a DLC film, or the like can be formed.

Furthermore, the light-emitting elements 4513 and 540 may be covered with respective layers containing an organic compound deposited by an evaporation method so that oxygen, hydrogen, moisture, carbon dioxide, or the like do not enter the light-emitting elements 4513 and 540.

In addition, in a space which is formed with the substrate 4001, the substrate 4006, and the sealant 4005, a filler 4514 is provided for sealing. It is preferable that the light-emitting element 4513 be packaged (sealed) with a protective film (such as a laminate film or an ultraviolet curable resin film) or a cover material with high air-tightness and little degasification so that the light-emitting element 4513 is not exposed to the outside air, in this manner.

As the filler 4514, an ultraviolet curable resin or a thermosetting resin can be used as well as an inert gas such as nitrogen or argon. For example, polyvinyl chloride (PVC), an acrylic resin, a polyimide resin, an epoxy resin, a silicone resin, polyvinyl butyral (PVB), or ethylene vinyl acetate (EVA) can be used. For example, nitrogen is used as the filler.

In addition, if necessary, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Furthermore, the polarizing plate or the circularly polarizing plate may be provided with an anti-reflection film. For example, anti-glare treatment by which reflected light can be diffused by projections and/or depressions on the surface so as to reduce the glare can be performed.

Furthermore, electronic paper in which electronic ink is driven can be provided as the display device. The electronic paper is also referred to as electrophoretic display device (electrophoretic display) and is advantageous in that it exhibits the same level of readability as plain paper, it has lower power consumption than other display devices, and it can be made thin and lightweight.

Although the electrophoretic display device can have various modes, the electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. The first particles and the second particles each contain a pigment and do not move without an electric field. Moreover, the first particles and the second particles have different colors (which may be colorless).

Thus, an electrophoretic display device is a display device that utilizes a dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

The first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

In FIGS. 5A to 5C, FIGS. 6A and 6B, and FIGS. 7A and 7B, a flexible substrate as well as a glass substrate can be used as the substrates 4001, 500 and 4006. For example, a light-transmitting plastic substrate or the like can be used. As plastic, a fiberglass-reinforced plastics (FRP) plate, a polyvinyl fluoride (PVF) film, a polyester film, or an acrylic resin film can be used. In the case where the light-transmitting property is not necessary, a metal substrate (metal film) of aluminum, stainless steel, or the like may be used. For example, a sheet with a structure in which an aluminum foil is sandwiched between PVF films or polyester films can be used.

In this embodiment, an aluminum oxide film is used as the insulating film 4020. The insulating film 4020 can be formed by a sputtering method or a plasma CVD method.

The aluminum oxide film which is provided as the insulating film 4020 over the oxide semiconductor film has a high shielding effect (blocking effect) of preventing penetration of both oxygen and impurities such as hydrogen and moisture through the film.

Therefore, in and after the manufacturing process, the aluminum oxide film functions as a protective film for preventing entry of an impurity such as hydrogen or moisture, which might cause variation in electric characteristics, into the oxide semiconductor film, and release of oxygen, which is a main component material of the oxide semiconductor, from the oxide semiconductor film.

The insulating films 4021 and 506 each functioning as a planarization insulating film can be formed using an organic material having heat resistance, such as an acrylic resin, a polyimide resin, a benzocyclobutene-based resin, a polyamide resin, or an epoxy resin. Other than such organic materials, it is also possible to use a low-dielectric constant material (low-k material), a siloxane-based resin, phosphosilicate glass (PSG), borophosphosilicate glass (BPSG), or the like. Note that each of the insulating films may be formed by stacking a plurality of insulating films formed from these materials.

There is no particular limitation on the method of forming the insulating films 4021 and 506, and the following method or tool (equipment) can be used depending on the material: a sputtering method, spin coating, dipping, spray coating, a droplet discharge method (such as an ink-jet method), a printing method (such as screen printing or offset printing), a doctor knife, a roll coater, a curtain coater, a knife coater, or the like.

The display device displays an image by transmitting light from the light source or the display element. Therefore, the substrate and the thin films such as the insulating film and the conductive film provided for the pixel portion where light is transmitted have light-transmitting properties with respect to light in the visible light wavelength range.

The first electrode layer and the second electrode layer (also referred to as pixel electrode layer, common electrode layer, counter electrode layer, or the like) for applying voltage to the display element may have light-transmitting properties or light-reflecting properties, which depends on the direction in which light is extracted, the position where the electrode layer is provided, and the pattern structure of the electrode layer.

The first electrode layers 4030 and 541 and the second electrode layers 4031 and 543 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter also referred to as ITO), indium zinc oxide, indium tin oxide to which silicon oxide is added, or graphene.

The first electrode layers 4030 and 541 and the second electrode layers 4031 and 543 can be formed using one or plural kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a nitride of these metals.

In this embodiment, since the light-emitting device illustrated in FIGS. 6A and 6B has a bottom-emission structure, the first electrode layer 541 has a light-transmitting property and the second electrode layer 543 has a light-reflecting property. Accordingly, in the case of using a metal film as the first electrode layer 541, the film is preferably made thin enough to secure a light-transmitting property; and in the case of using a light-transmitting conductive film as the second electrode layer 543, a light-reflecting conductive film is preferably stacked therewith.

A conductive composition containing a conductive high molecule (also referred to as conductive polymer) can be used for the first electrode layers 4030 and 541 and the second electrode layers 4031 and 543. As the conductive high molecule, a π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be given.

Since the transistor is likely to be broken owing to static electricity or the like, a protection circuit for protecting the driver circuit is preferably provided. The protection circuit is preferably formed using a nonlinear element.

By applying any of the transistors described in Embodiments 1 to 3 as described above, semiconductor devices having a variety of functions can be provided.

The structures, methods, and the like described in this embodiment can be combined as appropriate with any of the structures, methods, and the like described in the other embodiments.

Embodiment 5

A semiconductor device having an image sensor function for reading data on an object can be formed with the use of the transistor described in any of Embodiments 1 to 3.

Figure 8A:
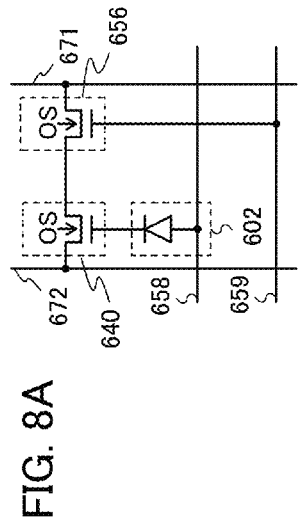
FIGS. 8A and 8B are a circuit diagram and a cross-sectional view which illustrate one embodiment of a semiconductor device.

FIG. 8A illustrates an example of a semiconductor device having an image sensor function. FIG. 8A is an equivalent circuit diagram of a photosensor, and FIG. 8B is a cross-sectional view of part of the photosensor.

One electrode of a photodiode 602 is electrically connected to a photodiode reset signal line 658, and the other electrode of the photodiode 602 is electrically connected to a gate of a transistor 640. One of a source and a drain of the transistor 640 is electrically connected to a photosensor reference signal line 672, and the other of the source and the drain thereof is electrically connected to one of a source and a drain of a transistor 656. A gate of the transistor 656 is electrically connected to a gate signal line 659, and the other of the source and the drain thereof is electrically connected to a photosensor output signal line 671.

In the circuit diagrams in this specification, a transistor including an oxide semiconductor film is denoted by a symbol "OS" so that it can be clearly identified as a transistor including an oxide semiconductor film. In FIG. 8A, the transistors 640 and 656 are transistors each including an oxide semiconductor film, to which any of the transistors described in Embodiments 1 to 3 can be applied. In this embodiment, an example in which a transistor having a structure similar to that of the transistor 430 described in Embodiment 2 is used is described. The transistor 640 is an inverted-staggered transistor having a bottom-gate structure in which an insulating layer functioning as a channel protective film is provided over an oxide semiconductor film.

Figure 8B:
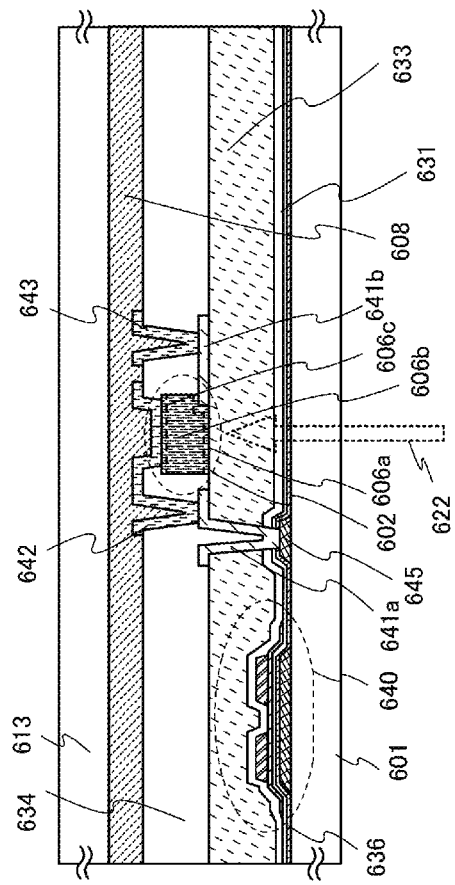

FIG. 8B is a cross-sectional view of the photodiode 602 and the transistor 640 in the photosensor. The transistor 640 and the photodiode 602 functioning as a sensor are provided over a glass substrate 601 which is a glass substrate. A substrate 613 is provided over the photodiode 602 and the transistor 640 with the use of an adhesive layer 608.

A first gate insulating film 636 covers a gate electrode layer of the transistor 640 and can be formed using a nitride insulating film. For example, a silicon nitride film and a silicon nitride oxide film can be given. The thickness of the first gate insulating film 636 can be greater than or equal to 20 nm and less than or equal to 350 nm The first gate insulating film 636 may have a single-layer structure or a layered structure. In this embodiment, as the first gate insulating film 636, a silicon nitride film obtained by a plasma CVD method is used.

An insulating film 631, an interlayer insulating film 633, and an interlayer insulating film 634 are provided over the transistor 640. The photodiode 602 is provided over the interlayer insulating film 633. In the photodiode 602, a first semiconductor film 606a, a second semiconductor film 606b, and a third semiconductor film 606c are stacked in this order from the interlayer insulating film 633 side, between electrode layers 641a and 641b formed over the interlayer insulating film 633 and an electrode layer 642 formed over the interlayer insulating film 634.

The electrode layer 641b is electrically connected to a conductive layer 643 formed over the interlayer insulating film 634, and the electrode layer 642 is electrically connected to a conductive layer 645 through the electrode layer 641a. The conductive layer 645 is electrically connected to the gate electrode layer of the transistor 640, and the photodiode 602 is electrically connected to the transistor 640.

Here, a pin photodiode in which a semiconductor film having p-type conductivity as the first semiconductor film 606a, a high-resistance semiconductor film (i-type semiconductor film) as the second semiconductor film 606b, and a semiconductor film having n-type conductivity as the third semiconductor film 606c are stacked is illustrated as an example.

The first semiconductor film 606a is a p-type semiconductor film and can be formed using an amorphous silicon film containing an impurity element imparting p-type conductivity. The first semiconductor film 606a is formed by a plasma CVD method with the use of a semiconductor source gas containing an impurity element belonging to Group 13 (e.g., boron (B)). As the semiconductor source gas, silane ($SiH_4$) can be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be added to the amorphous silicon film by a diffusion method or an ion implantation method. Heating or the like can be performed after the impurity element is added by an ion implantation method or the like to diffuse the impurity element. In that case, as the method of forming the amorphous silicon film, an LPCVD method, a vapor deposition method, a sputtering method, or the like is used. The first semiconductor film 606a is preferably formed with a thickness greater than or equal to 10 nm and less than or equal to 50 nm.

The second semiconductor film 606b is an i-type semiconductor film (intrinsic semiconductor film) and is formed using an amorphous silicon film. As for formation of the second semiconductor film 606b, an amorphous silicon film is formed by a plasma CVD method with the use of a semiconductor source gas. As the semiconductor source gas, silane ($SiH_4$) can be used. Alternatively, $Si_2H_6$, $SiH_2Cl_2$, $SiHCl_3$, $SiCl_4$, $SiF_4$, or the like may be used. The second semiconductor film 606b may be formed by an LPCVD method, a vapor deposition method, a sputtering method, or the like. The second semiconductor film 606b is preferably formed with a thickness greater than or equal to 200 nm and less than or equal to 1000 nm.

The third semiconductor film 606c is an n-type semiconductor film and is formed using an amorphous silicon film containing an impurity element imparting n-type conductivity. The third semiconductor film 606c is formed by a plasma CVD method with the use of a semiconductor source gas containing an impurity element belonging to Group 15 (e.g., phosphorus (P)). As the semiconductor source gas, silane ($SiH_4$) can be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be added to the amorphous silicon film by a diffusion method or an ion implantation method. Heating or the like can be performed after the impurity element is added by an ion implantation method or the like to diffuse the impurity element. In that case, as the method of forming the amorphous silicon film, an LPCVD method, a vapor deposition method, a sputtering method, or the like is used. The third semiconductor film 606c is preferably formed with a thickness greater than or equal to 20 nm and less than or equal to 200 nm.

The first semiconductor film 606a, the second semiconductor film 606b, and the third semiconductor film 606c are not necessarily formed using an amorphous semiconductor, and may be formed using a polycrystalline semiconductor or a microcrystalline semiconductor (semi-amorphous semiconductor: SAS).

The mobility of holes generated by the photoelectric effect is lower than the mobility of electrons. Therefore, a pin photodiode has better characteristics when a surface on the p-type semiconductor film side is used as a light-receiving plane. Here, an example in which light 622 received by the photodiode 602 from a surface of the substrate 601, over which the pin photodiode is formed, is converted into electric signals is described. Furthermore, light from the semiconductor film having the conductivity type opposite to that of the semiconductor film on the light-receiving plane is disturbance light; therefore, the electrode layer is formed using a light-blocking conductive film. A surface on the n-type semiconductor film side can alternatively be used as the light-receiving plane.

With the use of an insulating material, the insulating film 631, the interlayer insulating film 633 and the interlayer insulating film 634 can be formed using the following method or tool (equipment) depending on the material: a sputtering method, a plasma CVD method, spin coating, dipping, spray coating, a droplet discharge method (such as an ink-jet method), or a printing method (such as screen printing or offset printing).

The insulating film 631 can be formed using an inorganic insulating material and can have a single-layer structure or a layered structure including any of oxide insulating films such as a silicon oxide layer, a silicon oxynitride layer, an aluminum oxide layer, and an aluminum oxynitride layer; and nitride insulating films such as a silicon nitride layer, a silicon nitride oxide layer, an aluminum nitride layer, and an aluminum nitride oxide layer.

In this embodiment, an aluminum oxide film is used as the insulating film 631. The insulating film 631 can be formed by a sputtering method or a plasma CVD method.

The aluminum oxide film which is provided as the insulating film 631 over the oxide semiconductor film has a high shielding effect (blocking effect) of preventing penetration of both oxygen and impurities such as hydrogen and moisture through the film.

Therefore, in and after the manufacturing process, the aluminum oxide film functions as a protective film for preventing entry of an impurity such as hydrogen or moisture, which might cause variation in electric characteristics, into the oxide semiconductor film, and release of oxygen, which is a main component material of the oxide semiconductor, from the oxide semiconductor film.

To reduce surface roughness, an insulating film functioning as a planarization insulating film is preferably used as each of the interlayer insulating films 633 and 634. For the interlayer insulating films 633 and 634, for example, an organic insulating material having heat resistance, such as a polyimide resin, an acrylic resin, a benzocyclobutene-based resin, a polyamide resin, or an epoxy resin, can be used. Other than such organic insulating materials, it is possible to use a single layer or stacked layers of a low-dielectric constant material (low-k material), a siloxane-based resin, phosphosilicate glass (PSG), borophosphosilicate glass (BPSG), or the like.

With detection of light that enters the photodiode 602, data on an object to be detected can be read. A light source such as a backlight can be used at the time of reading data on the object to be detected.

The gate electrode layer of the transistor 640 is covered with the first gate insulating film 636, and a second gate insulating film and an oxide semiconductor film of the transistor 640 are protected from contamination caused by a metal element contained in the substrate 601.

Consequently, a highly reliable semiconductor device which includes the transistor 640 including the oxide semiconductor film and having stable electric characteristics, which is described in this embodiment, can be provided. Furthermore, the highly reliable semiconductor device can be manufactured at high yield, whereby high productivity can be achieved.

The structures, methods, and the like described in this embodiment can be combined as appropriate with any of the structures, methods, and the like described in the other embodiments.

Embodiment 6

A semiconductor device disclosed in this specification can be applied to a variety of electronic devices (including game machines). Examples of electronic devices include a television set (also referred to as television or television receiver), a monitor of a computer, cameras such as a digital camera and a digital video camera, a digital photo frame, a mobile phone, a portable game machine, a portable information terminal, an audio reproducing device, a game machine (e.g., a pachinko machine or a slot machine), and a game console. Specific examples of these electronic devices are illustrated in FIGS. 9A to 9C.

Figure 9A:
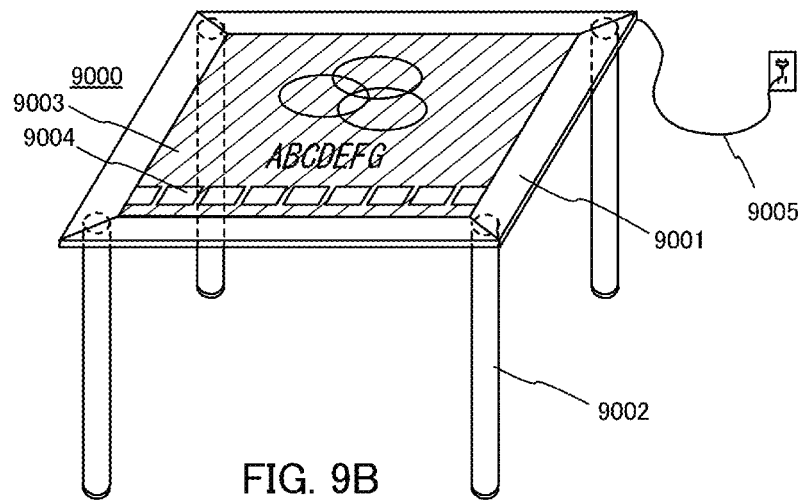
FIGS. 9A to 9C illustrate electronic devices.
Figure 9B:
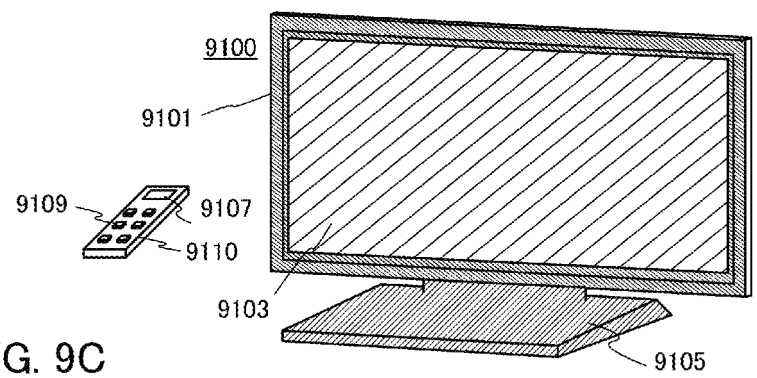
Figure 9C:
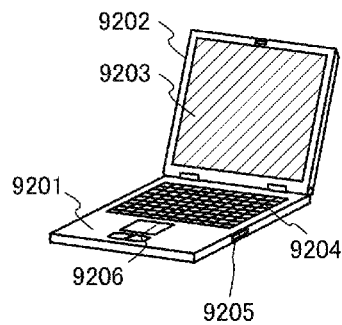

FIG. 9A illustrates a table 9000 having a display portion. In the table 9000, a display portion 9003 is incorporated in a housing 9001 and an image can be displayed on the display portion 9003. Note that the housing 9001 is supported by four leg portions 9002. Furthermore, a power cord 9005 for supplying power is provided for the housing 9001.

The semiconductor device described in any of Embodiments 1 to 5 can be used for the display portion 9003 so that the table 9000 having the display portion can have a high reliability.

The display portion 9003 has a touch-input function. When users touch displayed buttons 9004 which are displayed on the display portion 9003 of the table 9000 with their fingers or the like, the users can carry out operation of the screen and input of data. Furthermore, when the table may be made to communicate with home appliances or control the home appliances, the display portion 9003 may function as a control device which controls the home appliances by operation on the screen. For example, with the use of the semiconductor device having an image sensor function described in Embodiment 5, the display portion 9003 can have a touch-input function.

Furthermore, the screen of the display portion 9003 can be placed perpendicular to a floor with a hinge provided for the housing 9001; thus, the table 9000 can also be used as a television set. When a television device having a large screen is set in a small room, an open space is reduced; however, when a display portion is incorporated in the table, a space in the room can be efficiently used.

FIG. 9B illustrates a television set 9100. In the television set 9100, a display portion 9103 is incorporated in a housing 9101 and an image can be displayed on the display portion 9103. Note that here the housing 9101 is supported by a stand 9105.

The television set 9100 can be operated with an operation switch of the housing 9101 or a separate remote controller 9110. Channels and volume can be controlled with an operation key 9109 of the remote controller 9110 so that an image displayed on the display portion 9103 can be controlled. Furthermore, the remote controller 9110 may be provided with a display portion 9107 for displaying data output from the remote controller 9110.

The television set 9100 illustrated in FIG. 9B is provided with a receiver, a modem, and the like. With the receiver, the television set 9100 can receive a general television broadcast. Furthermore, when the television set 9100 is connected to a communication network with or without wires connection via the modem, one-way (from a transmitter to a receiver) or two-way (between a transmitter and a receiver or between receivers) data communication can be performed.

The semiconductor device described in any of Embodiments 1 to 5 can be used for the display portions 9103 and 9107 so that the television set and the remote controller can have a high reliability.

FIG. 9C illustrates a computer, which includes a main body 9201, a housing 9202, a display portion 9203, a keyboard 9204, an external connection port 9205, a pointing device 9206, and the like.

The semiconductor device described in any of Embodiments 1 to 5 can be used for the display portion 9203 so that the computer can have a high reliability.

FIGS. 10A and 10B illustrate an example of a foldable tablet. FIG. 10A illustrates the tablet which is unfolded. The tablet includes a housing 9630, a display portion 9631a, a display portion 9631b, a display mode switch 9034, a power switch 9035, a power-saving mode switch 9036, a clasp 9033, and an operation switch 9038.

The semiconductor device described in any of Embodiments 1 to 5 can be used for the display portions 9631a and 9631b so that the tablet terminal can have a high reliability.

Part of the display portion 9631a can be a touch panel region 9632a, and data can be input by touching operation keys 9638 that are displayed. Although a structure in which a half region in the display portion 9631a has only a display function and the other half region has a touch panel function is shown as an example, the display portion 9631a is not limited to this structure. The whole region in the display portion 9631a may have a touch panel function. For example, the display portion 9631a can display keyboard buttons in the whole region to be a touch panel, and the display portion 9631b can be used as a display screen.

In a manner similar to that of the display portion 9631a, part of the display portion 9631b can be a touch panel region 9632b. When a keyboard display switching button 9639 displayed on the touch panel is touched with a finger, a stylus, or the like, a keyboard can be displayed on the display portion 9631b.

Touch input can be performed in the touch panel region 9632a and the touch panel region 9632b at the same time.

The switch 9034 for switching display modes can switch the display between a portrait mode and a landscape mode, and between monochrome display and color display, for example. The switch 9036 for switching to power-saving mode can control display luminance to be optimal in accordance with the amount of external light in use of the tablet terminal which is detected by an optical sensor incorporated in the tablet terminal. Another detection device including a sensor for detecting inclination, such as a gyroscope or an acceleration sensor, may be incorporated in the tablet terminal, in addition to the optical sensor.

Although the display portion 9631a and the display portion 9631b have the same display area in FIG. 10A, one embodiment of the present invention is not particularly limited to this example. The display portion 9631a and the display portion 9631b may have different areas or different display quality. For example, higher definition images may be displayed on one of the display portions 9631a and 9631b.

FIG. 10B illustrates the tablet terminal which is folded, which includes the housing 9630, a solar battery 9633, a charge and discharge control circuit 9634, a battery 9635, and a DC-DC converter 9636. As an example, FIG. 10B illustrates the charge and discharge control circuit 9634 including the battery 9635 and the DC-DC converter 9636.

Since the tablet terminal can be folded, the housing 9630 can be closed when not in use. Thus, the display portions 9631a and 9631b can be protected, which makes it possible to provide a tablet terminal with high durability and improved reliability for long-term use.

The tablet terminal illustrated in FIGS. 10A and 10B can also have a function of displaying various kinds of data (e.g., a still image, a moving image, and a text image), a function of displaying a calendar, the date, the time, or the like on the display portion, a touch-input function of operating or editing data displayed on the display portion by touch input, a function of controlling processing by various kinds of software (programs), and the like.

The solar battery 9633, which is attached on a surface of the tablet terminal, can supply electric power to a touch panel, a display portion, an image signal processor, and the like. Note that the solar battery 9633 can be provided on one or two surfaces of the housing 9630, so that the battery 9635 can be charged efficiently. The use of a lithium ion battery as the battery 9635 is advantageous in downsizing or the like.

The structure and operation of the charge and discharge control circuit 9634 illustrated in FIG. 10B will be described with reference to a block diagram in FIG. 10C. FIG. 10C illustrates the solar battery 9633, the battery 9635, the DC-DC converter 9636, a converter 9637, switches SW1 to SW3, and a display portion 9631. The battery 9635, the DC-DC converter 9636, the converter 9637, and the switches SW1 to SW3 correspond to the charge and discharge control circuit 9634 illustrated in FIG. 10B.

First, an example of operation in the case where power is generated by the solar battery 9633 using external light is described. The voltage of power generated by the solar battery 9633 is raised or lowered by the DC-DC converter 9636 so that a voltage for charging the battery 9635 is obtained. When the display portion 9631 is operated with the power from the solar battery 9633, the switch SW1 is turned on and the voltage of the power is raised or lowered by the converter 9637 to a voltage needed for operating the display portion 9631. In addition, when display on the display portion 9631 is not performed, the switch SW1 is turned off and the switch SW2 is turned on so that charge of the battery 9635 may be performed.

Although the solar battery 9633 is shown as an example of a charge means, there is no particular limitation on the charge means and the battery 9635 may be charged with another means such as a piezoelectric element or a thermoelectric conversion element (Peltier element). For example, the battery 9635 may be charged with a non-contact power transmission module which is capable of charging by transmitting and receiving power by wireless (without contact), or another charge means used in combination.

The structures, methods, and the like described in this embodiment can be combined as appropriate with any of the structures, methods, and the like described in the other embodiments.

This application is based on Japanese Patent Application serial no. 2011-285559 filed with Japan Patent Office on Dec. 27, 2011, the entire contents of which are hereby incorporated by reference.

What is claimed is:

1. A method for manufacturing a semiconductor device, the method comprising the steps of:
   forming a gate electrode layer over a substrate;
   forming a first gate insulating film over the gate electrode layer;
   forming a second gate insulating film over the first gate insulating film;
   performing a first heat treatment at a temperature higher than or equal to 450° C. after the formation of the second gate insulating film;
   forming an oxide semiconductor film over the second gate insulating film after the first heat treatment; and
   performing a second heat treatment after the formation of the oxide semiconductor film,
   wherein the first gate insulating film is formed by a plasma CVD method using a first RF power, a silane gas, a nitrogen gas, and an ammonia gas,
   wherein the second gate insulating film is formed by a plasma CVD method using a second RF power, a silane gas and a nitrogen dioxide gas, and
   wherein the first RF power is higher than the second RF power.

2. A method for manufacturing a semiconductor device, the method comprising the steps of:
   forming a gate electrode layer over a substrate;
   forming a first gate insulating film over the gate electrode layer;
   forming a second gate insulating film over the first gate insulating film;
   performing a first heat treatment at a temperature higher than or equal to 450° C. after the formation of the second gate insulating film;
   forming an oxide semiconductor film over the second gate insulating film after the first heat treatment;
   performing a second heat treatment after the formation of the oxide semiconductor film;
   forming a source electrode layer and a drain electrode layer over and in electrical contact with the oxide semiconductor film after the second heat treatment; and
   performing a third heat treatment after the formation of the source electrode layer and the drain electrode layer,
   wherein the first gate insulating film is formed by a plasma CVD method using a first RF power, a silane gas, a nitrogen gas, and an ammonia gas,
   wherein the second gate insulating film is formed by a plasma CVD method using a second RF power, a silane gas and a nitrogen dioxide gas, and
   wherein the first RF power is higher than the second RF power.

3. The method for manufacturing a semiconductor device, according to claim 1,
   wherein the temperature is equal to or higher than 650° C.

4. The method for manufacturing a semiconductor device, according to claim 2,
   wherein the temperature is equal to or higher than 650° C.

5. The method for manufacturing a semiconductor device, according to claim 1,
wherein a flow rate of the silane gas used to form the first gate insulating layer is higher than a flow rate of the silane gas used to form the second gate insulating layer.

6. The method for manufacturing a semiconductor device, according to claim 2,
wherein a flow rate of the silane gas used to form the first gate insulating layer is higher than a flow rate of the silane gas used to form the second gate insulating layer.

7. The method for manufacturing a semiconductor device, according to claim 1,
wherein the first gate insulating film is formed at a higher pressure than the second gate insulating film,
wherein the first gate insulating film is a silicon nitride film and the second gate insulating film is a silicon oxynitride film.

8. The method for manufacturing a semiconductor device, according to claim 2,
wherein the first gate insulating film is formed at a higher pressure than the second gate insulating film,
wherein the first gate insulating film is a silicon nitride film and the second gate insulating film is a silicon oxynitride film.

9. The method for manufacturing a semiconductor device, according to claim 1,
wherein the first gate insulating film is a silicon nitride film and the second gate insulating film is a silicon oxynitride film, and
wherein the second gate insulating film is thicker than the first gate insulating film.

10. The method for manufacturing a semiconductor device, according to claim 2,
wherein the first gate insulating film is a silicon nitride film and the second gate insulating film is a silicon oxynitride film, and
wherein the second gate insulating film is thicker than the first gate insulating film.

11. The method for manufacturing a semiconductor device, according to claim 1, further comprising the step of:
forming an oxide layer on and in contact with the oxide semiconductor film.

12. The method for manufacturing a semiconductor device, according to claim 2, further comprising the step of:
forming an oxide layer on and in contact with the oxide semiconductor film.

13. The method for manufacturing a semiconductor device, according to claim 1,
wherein the oxide semiconductor film is a c-axis aligned crystalline oxide semiconductor film.

14. The method for manufacturing a semiconductor device, according to claim 2,
wherein the oxide semiconductor film is a c-axis aligned crystalline oxide semiconductor film.

15. The method for manufacturing a semiconductor device, according to claim 1,
wherein TDS measurements evidence a reduction in hydrogen concentration of the first gate insulating film when the first heat treatment is performed.

16. The method for manufacturing a semiconductor device, according to claim 2,
wherein TDS measurements evidence a reduction in hydrogen concentration of the first gate insulating film when the first heat treatment is performed.

17. The method for manufacturing a semiconductor device, according to claim 1,
wherein TDS measurements evidence a reduction in hydrogen release due to the first heat treatment.

18. The method for manufacturing a semiconductor device, according to claim 2,
wherein TDS measurements evidence a reduction in hydrogen release due to the first heat treatment.

19. The method for manufacturing a semiconductor device, according to claim 1,
wherein a transistor comprising the oxide semiconductor film as an active layer is a normally-off transistor.

20. The method for manufacturing a semiconductor device, according to claim 2,
wherein a transistor comprising the oxide semiconductor film as an active layer is a normally-off transistor.

21. A method for manufacturing a display device comprising the method for manufacturing a semiconductor device according to claim 1.

22. A method for manufacturing a display device comprising the method for manufacturing a semiconductor device according to claim 2.

* * * * *